(12) United States Patent
Kobayashi et al.

(10) Patent No.: US 9,324,876 B2
(45) Date of Patent: Apr. 26, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Yoshiyuki Kobayashi, Atsugi (JP); Daisuke Matsubayashi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 49 days.

(21) Appl. No.: 14/474,533

(22) Filed: Sep. 2, 2014

(65) Prior Publication Data

US 2015/0069384 A1    Mar. 12, 2015

(30) Foreign Application Priority Data

Sep. 6, 2013    (JP) ................................. 2013-184772

(51) Int. Cl.
*H01L 31/06*    (2012.01)
*H01L 29/786*    (2006.01)
*H01L 29/417*    (2006.01)

(52) U.S. Cl.
CPC ...... *H01L 29/7869* (2013.01); *H01L 29/41733* (2013.01); *H01L 29/78696* (2013.01)

(58) Field of Classification Search
CPC ............ H01L 2924/00; H01L 29/2003; H01L 29/66462; H01L 2924/13091; H01L 27/0605; H01L 2924/0002; H01L 29/778; H01L 29/7787; H01L 21/8258; H01L 29/1054
USPC .............. 257/59, 43, E21.411, 402, 183, 192, 257/201, 268, 269, 35, 42, 471, 472, 475, 257/73, E21.407, E21.453, E29.149; 438/151
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Mary Wilczewski
*Assistant Examiner* — Tsz Chiu
(74) *Attorney, Agent, or Firm* — Robinson Intellectual Property Law Office; Eric J. Robinson

(57) ABSTRACT

A semiconductor device includes a first oxide semiconductor film over an insulating surface; a second oxide semiconductor film over the first oxide semiconductor film; a source electrode and a drain electrode in contact with side surfaces of the first oxide semiconductor film, side surfaces of the second oxide semiconductor film, and the top surface of the second oxide semiconductor film; a third oxide semiconductor film over the second oxide semiconductor film, the source electrode, and the drain electrode; a gate insulating film over the third oxide semiconductor film; and a gate electrode in contact with the top surface of the gate insulating film. A length obtained by subtracting a channel length between the source electrode and the drain electrode from a length of the second oxide semiconductor film in the channel length direction is 0.2 times to 2.0 times as long as the channel length.

8 Claims, 27 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,384,080 B2 | 2/2013 | Taniguchi et al. |
| 8,547,771 B2 | 10/2013 | Koyama |
| 8,692,252 B2 | 4/2014 | Takata et al. |
| 2001/0043112 A1* | 11/2001 | Voldman ............. H01L 27/1203 327/534 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0104140 A1* | 5/2005 | Pan .................... H01L 29/78696 257/411 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134390 A1* | 5/2009 | Kodama ............. H01L 27/1214 257/43 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0140100 A1* | 6/2011 | Takata ................ H01L 29/7869 257/43 |
| 2011/0240991 A1 | 10/2011 | Yamazaki |
| 2014/0034946 A1 | 2/2014 | Yamazaki et al. |
| 2014/0042437 A1 | 2/2014 | Yamazaki |
| 2014/0042438 A1 | 2/2014 | Yamazaki |
| 2014/0077205 A1 | 3/2014 | Yamazaki et al. |
| 2014/0103337 A1 | 4/2014 | Yamazaki et al. |
| 2014/0103346 A1 | 4/2014 | Yamazaki |
| 2014/0131702 A1 | 5/2014 | Matsubayashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-124360 A | 6/2011 |
| JP | 2011-138934 A | 7/2011 |
| JP | 2012-257187 A | 12/2012 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn] at Tem-

(56) References Cited

OTHER PUBLICATIONS peratures Over 1000° C.", Journal of Solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System". Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advances Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposiuim Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

(56) References Cited

OTHER PUBLICATIONS

Orita.M et al., "Mechanism of Electrical Conductivity of Transparent InGaZnO4", Phys. Rev. B.(Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Sociert of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

SEMICONDUCTOR DEVICE AND METHOD FOR MANUFACTURING THE SAME

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a semiconductor device or a method for manufacturing a semiconductor device.

In this specification, a semiconductor device generally means a device that can function by utilizing semiconductor characteristics. A display device, an electro-optical device, a semiconductor circuit, and an electronic device may include a semiconductor device.

2. Description of the Related Art

Attention has been focused on a technique for formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and in addition, an oxide semiconductor has been attracting attention.

For example, Patent Document 1 discloses a transistor including an amorphous oxide semiconductor film containing indium (In), gallium (Ga), and zinc (Zn).

Patent Documents 2 and 3 disclose techniques for improving carrier mobility by stacking oxide semiconductor films.

A transistor including an oxide semiconductor film to have an extremely low leakage current in an off state. For example, a CPU with low-power consumption utilizing the low leakage current of the transistor including an oxide semiconductor film is disclosed (see Patent Document 4).

REFERENCE

Patent Documents

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187

SUMMARY OF THE INVENTION

Miniaturization of transistors has been progressing with an increase in the degree of integration of circuits. Miniaturization of transistors may cause deterioration of the electrical characteristics of the transistors, such as an on-state current, an off-state current, a threshold voltage, and a subthreshold swing (S value). In general, a decrease in channel length leads to an increase in off-state current, an increase in fluctuation of a threshold voltage, and an increase in S value. In addition, a decrease in a channel width leads to a decrease in on-state current.

Thus, an object of one embodiment of the present invention is to provide a semiconductor device having a structure that can prevent deterioration of the electrical characteristics, which becomes more significant with miniaturization. Another object is to provide a highly integrated semiconductor device. Another object is to provide a semiconductor device in which deterioration of on-state current characteristics is reduced. Another object is to provide a semiconductor device with low power consumption. Another object is to provide a semiconductor device with high reliability. Another object is to provide a semiconductor device that can hold data even when power supply is stopped. Another object is to provide a semiconductor device with good characteristics. Another object is to provide a novel semiconductor device.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is a semiconductor device including a first oxide semiconductor film over an insulating surface; a second oxide semiconductor film over the first oxide semiconductor film; a source electrode and a drain electrode in contact with side surfaces of the first oxide semiconductor film, side surfaces of the second oxide semiconductor film, and the top surface of the second oxide semiconductor film; a third oxide semiconductor film over the second oxide semiconductor film, the source electrode, and the drain electrode; a gate insulating film over the third oxide semiconductor film; and a gate electrode in contact with the top surface of the gate insulating film and facing the top surface and the side surface of the second oxide semiconductor film. When the length of the second oxide semiconductor film in the channel length direction is referred to as a first length and the length between the source electrode and the drain electrode in the channel length direction is referred to as a second length, a third length that is obtained by subtracting the second length from 2) the first length is 0.2 times to 2.0 times as long as the second length.

Another embodiment of the present invention is a semiconductor device including a first oxide semiconductor film over an insulating surface; a second oxide semiconductor film over the first oxide semiconductor film; a third oxide semiconductor film over the second oxide semiconductor film; a source electrode and a drain electrode in contact with side surfaces of the first oxide semiconductor film, side surfaces of the second oxide semiconductor film, side surfaces of the third oxide semiconductor film, and the top surface of the third oxide semiconductor film; a gate insulating film over the third oxide semiconductor film, the source electrode, and the drain electrode; and a gate electrode in contact with the top surface of the gate insulating film and facing the top surface and the side surface of the second oxide semiconductor film. When the length of the second oxide semiconductor film in the channel length direction is referred to as a first length and the length between the source electrode and the drain electrode in the channel length direction is referred to as a second length, a third length that is obtained by subtracting the second length from the first length is 0.2 times to 2.0 times as long as the second length.

In any of the above structures, the third length is preferably longer than or equal to 30 nm and shorter than or equal to 60 nm.

In any of the above structures, the first length is preferably shorter than or equal to 40 nm.

In any of the above structures, a channel width is preferably shorter than or equal to 40 nm.

According to one embodiment of the present invention, a semiconductor device in which deterioration of electrical characteristics that becomes more noticeable as a transistor is miniaturized can be suppressed can be provided. A highly integrated semiconductor device can be provided. A semiconductor device in which deterioration of on-state current characteristics is reduced can be provided. A semiconductor device with low power consumption can be provided. A highly reliable semiconductor device can be provided. A semiconductor device that can hold data even when power supply is stopped can be provided. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

DETAILED DESCRIPTION OF THE INVENTION

Figure 1A:
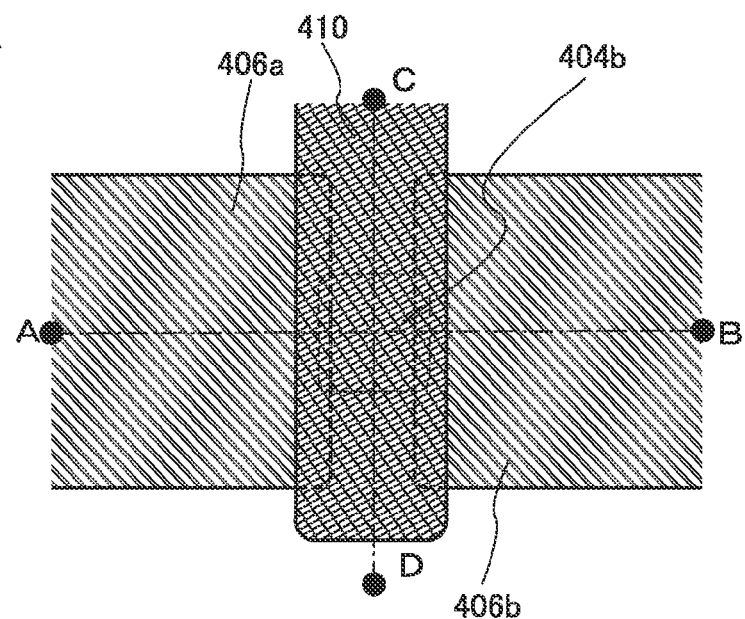
FIGS. 1A to 1C are a top view and cross-sectional views illustrating a transistor.

Embodiments are described in detail with reference to drawings. Note that the present invention is not limited to the following description and it is readily appreciated by those skilled in the an that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that what is described (or part thereof) in an embodiment can be applied to, combined with, or exchanged with another content in the same embodiment and/or what is described (or part thereof) in another embodiment or other embodiments.

Note that in each embodiment, a content described in the embodiment is a content described with reference to a variety of diagrams or a content described with a text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, a semiconductor device of one embodiment of the present invention is described with reference to drawings.

Figure 1B:
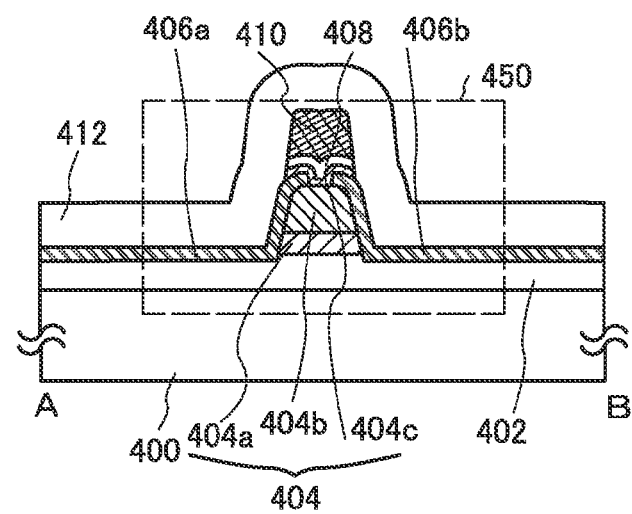
Figure 1C:
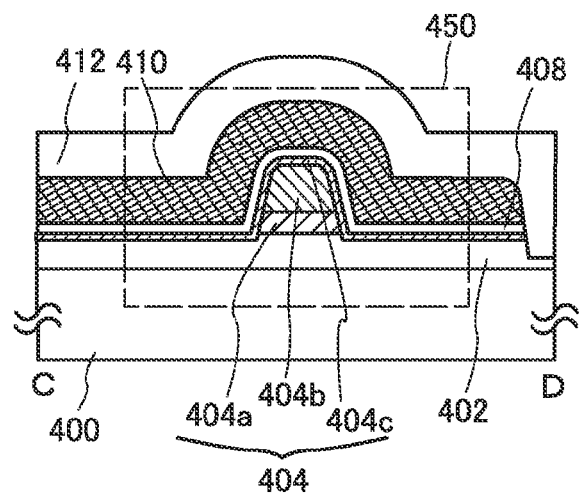

FIGS. 1A to 1C are a top view and cross-sectional views illustrating a transistor of one embodiment of the present invention. FIG. 1A is a top view. FIG. 1B illustrates across section taken along dashed-dotted line A-B of FIG. 1A. FIG. 1C illustrates across section taken along dashed-dotted line C-D of FIG. 1A. Note that some components are not illustrated in the top view of FIG. 1A for simplification. The direction of the dashed-dotted line A-B and the direction of the dashed-dotted line C-D can be referred to as a channel length direction and a channel width direction, respectively.

A transistor 450 illustrated in FIGS. 1A to 1C includes a base insulating film 402 having a projecting portion over a substrate 400; an oxide semiconductor film 404a and an oxide semiconductor film 404b over the projecting portion of the base insulating film 402; a source electrode 406a and a drain electrode 406b over the oxide semiconductor films 404a and 404b; an oxide semiconductor film 404c in contact with the top surface of part of the base insulating film 402 that does not overlap with the oxide semiconductor film 404a, side surfaces of the projecting portion of the base insulating film 402, side surfaces of the oxide semiconductor film 404a, side surfaces of the oxide semiconductor film 404b, the top surface of the oxide semiconductor film 404b, the source electrode 406a, and the drain electrode 406b; a gate insulating film 408 over the oxide semiconductor film 404c; a gate electrode 410 that is in contact with the top surface of the gate insulating film 408 and faces the top and side surfaces of the oxide semiconductor film 404b; and an oxide insulating film 412 over the source electrode 406a, the drain electrode 406b, and the gate electrode 410. Furthermore, the oxide semiconductor films 404a, 404b, and 404c are collectively referred to as a multilayer film 404.

Figure 2:
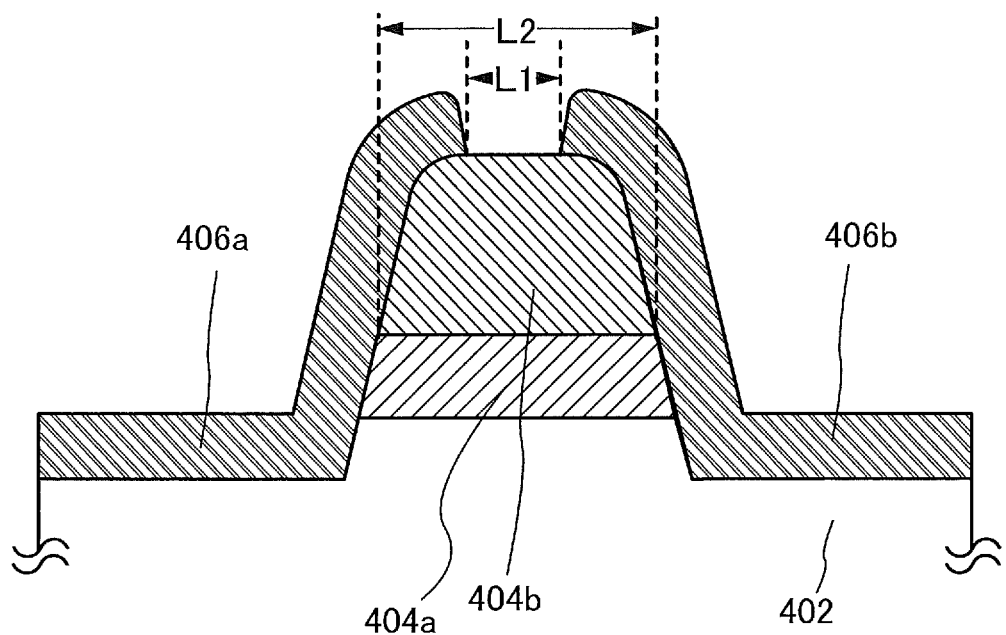
FIG. 2 is an enlarged view of FIG. 1B.

FIG. 2 is an enlarged view of FIG. 1B. In FIG. 2, L1 represents the length between the source electrode 406a and the drain electrode 406b, and L2 represents the length of the oxide semiconductor film 404b in the channel length direction. Note that like this embodiment, in the case where an oxide semiconductor film is tapered, L2 represents the length of the longest portion of the oxide semiconductor film 404b in the channel length direction.

Note that a channel length means a distance between a source (a source region or a source electrode) and a drain (a drain region or a drain electrode) in a region where a semiconductor film and a gate electrode overlap with each other in a top view. Accordingly in FIG. 1A, the channel length is a distance between the source electrode 406a and the drain electrode 406b in a region where the oxide semiconductor film 404b and the gate electrode 410 overlap with each other. A channel width means the length of a region where a source faces parallel to a drain and where a semiconductor film and a gate electrode overlap with each other. Accordingly, in FIG. 1A, the channel width is the length of a region where the source electrode 406a and the drain electrode 406b face each other and where the oxide semiconductor film 404b and the gate electrode 410 overlap with each other.

When the length obtained by subtracting L1 from L2 (hereinafter, the length is referred to as "L2−L1") is close to 0, current can be blocked at a side of the oxide semiconductor film 404b that is close to the gate electrode 410, but current flows at a side (back channel side) of the oxide semiconductor film 404b that is far from the gate electrode 410 because the electric field of the gate electrode 410 is suppressed by the influence of the source electrode 406a and the drain electrode 406b. In contrast, when L2−L1 increases longer than 0, the source electrode 406a and the drain electrode 406b are positioned at some distance from the gate electrode 410; thus, the electric field of the gate electrode 410 can reach the oxide semiconductor film 404b on the oxide semiconductor film 404a side, and current can be blocked in the whole oxide semiconductor film 404b.

Moreover, L2−L1 is preferably 0.2 tinges to 2.0 times, more preferably 0.5 times to 2.0 times, as long as L1. The length $L_s$ of a region in the channel length direction where the source electrode 406a overlaps with the oxide semiconductor film 404b is equal to the length $L_d$ of a region in the channel length direction where the drain electrode 406b overlaps with the oxide semiconductor film 404b. In the case where the length $L_s$ is different from the length $L_d$, the length $L_s$ or $L_d$ is preferably 0.1 times to 1.0 times, more preferably 0.25 times to 1.0 times, as long as L1. With that range, the values of the characteristics of a transistor hardly changes; thus, variations in electrical characteristics of the transistor can be reduced and high reliability can be obtained.

Furthermore, with that range, L2−L1 is preferably longer than or equal to 30 nm and shorter than or equal to 60 nm, more preferably longer than or equal to 40 nm and shorter than or equal to 50 nm.

In fabricating a transistor with a small channel length and a small channel width, an electrode, a semiconductor film, or the like is processed while a resist mask is reduced in size and consequently has a round end portion (curved surface) in some cases. With this structure, the coverage with the gate insulating film 408, the gate electrode 410, and the oxide insulating film 412, which are to be formed over the oxide semiconductor film 404b, can be improved. In addition, electric field concentration that might occur at end portions of the source electrode 406a and the drain electrode 406b can be reduced, which can suppress deterioration of the transistor.

Miniaturization of a transistor leads to high integration and high density. For example, the channel length (L1) of the transistor is preferably less than or equal to 40 nm, further preferably less than or equal to 30 nm, still further preferably less than or equal to 20 nm, and the channel width of the transistor is preferably less than or equal to 40 nm, further preferably less than or equal to 30 nm, still further preferably less than or equal to 20 nm.

The electric field of the gate electrode 410 electrically surrounds at least the oxide semiconductor film 404b in the channel width direction, which increases an on-state current. Such a structure of a transistor is referred to as a surrounded channel (s-channel) structure. In the s-channel structure, current flows through the whole oxide semiconductor film 404b. Since the current flows through the inside of the oxide semiconductor film 404b, an adverse effect of interface scattering is unlikely to occur, leading to a large amount of an on-state current. Note that an increase in the thickness of the oxide semiconductor film 404b enables the on-state current to increase. Thus, even when the gate electrode 410 extends (toward the base insulating film 402 side) to a portion lower than the interface between the oxide semiconductor film 404a and the oxide semiconductor film 404b, the channel width is not affected by such a structure, and the channel width can be made small. Thus, the high density (high integration) is achieved.

The substrate 400 is not limited to a simple support, and may be a substrate where an element such as a transistor or a capacitor is formed. In that case, at least one of the gate electrode 410, the source electrode 406a, and the drain electrode 406b of the transistor 450 may be electrically connected to the above element.

The base insulating film 402 can have a function of supplying oxygen to the multi-layer film 404 as well as a function of preventing diffusion of impurities from the substrate 400. Thus, the base insulating film 402 is preferably an insulating film containing oxygen. For example, an insulating film containing oxygen more than that in the stoichiometric composition is more preferable. Note that in the case where the substrate 400 is a substrate where an element is formed as described above, the base insulating film 402 has also a function as an interlayer insulating film. In that case, a surface of the base insulating film 402 may be planarized. For example, the base insulating film 402 may be subjected to planarization treatment such as chemical mechanical polishing (CMP) treatment.

The oxide semiconductor film is described in detail below.

The oxide semiconductor film is an oxide containing indium. The oxide semiconductor film can have high carrier mobility (electron mobility) by containing indium, for example. In addition, the oxide semiconductor film preferably includes an element M. The element M is aluminum, gallium, yttrium, or tin, for example. The element M is an element having high bonding energy with oxygen, for example. The element M is an element that can increase the energy gap of the oxide, for example. In addition, the oxide semiconductor film preferably contains zinc. When the oxide semiconductor film contains zinc, the oxide semiconductor film is easily crystallized, for example. The energy at the top of the valence band of the oxide semiconductor film can be controlled with the atomic ratio of zinc, for example.

Note that the oxide semiconductor film is not limited to the oxide containing indium. The oxide semiconductor film may be a Zn—Sn oxide or a Ga—Sn oxide, for example.

As the oxide semiconductor film, an oxide with a wide energy gap is used. For example, the energy gap of the oxide semiconductor film is set to be greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

In the case where the oxide semiconductor film is formed by a sputtering method, a target containing indium is preferably used in order to reduce the number of particles. In addition, if an oxide target having a high atomic ratio of the element M is used, the conductivity of the target may be decreased. In the case where a target containing indium is used, the conductivity of the target can be increased and DC discharge and AC discharge are facilitated; therefore, film formation over a large-sized substrate can be easily performed. Thus, semiconductor devices can be manufactured with high productivity.

In the case where the oxide semiconductor film is formed by a sputtering method, the atomic ratio of In to M and Zn contained in the target may be 3:1:1, 3:1:2, 3:1:4, 1:1:0.5, 1:1:1, 1:1:2, or the like.

In the cases where the oxide semiconductor film is formed by sputtering method, films having atomic ratios different from the atomic ratios of the targets used may be formed. Especially for zinc, the atomic ratio of zinc in a deposited film is smaller than the atomic ratio of the target in some cases. Specifically, the film in some cases has an atomic ratio of zinc of 40 atomic % to 90 atomic % of the atomic ratio of zinc in the target.

An influence of impurities in the oxide semiconductor film is described below. In order to obtain stable electrical characteristics of a transistor, it is effective to reduce the concentration of impurities in the oxide semiconductor film to have lower carrier density so that the oxide semiconductor film is highly purified. The carrier density of the oxide semiconductor film is set to be lower than $1\times10^{17}/cm^3$, lower than $1\times10^{15}/cm^3$, or lower than $1\times10^{13}/cm^3$. In order to reduce the concentration of impurities in the oxide semiconductor film, the concentration of impurities in a film that is adjacent to the oxide semiconductor film are preferably reduced.

For example, silicon in the oxide semiconductor film might serve as a carrier trap or a carrier generation source. Therefore, the concentration of silicon in a region between the oxide semiconductor film and the base insulating film measured by secondary ion mass spectrometry (SIMS) is set to be lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor film and the gate insulating film measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$.

Furthermore, when hydrogen is contained in the oxide semiconductor film, the carrier density is increased in some cases. The concentration of hydrogen in the oxide semiconductor film measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor film, the carrier density is increased in some cases. The concentration of nitrogen in the oxide semiconductor film measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the oxide semiconductor film in order to reduce the concentration of hydrogen in the base insulating film. The concentration of hydrogen in the base insulating film measured by SIMS is set to be lower than or equal to $2\times10^{20}$ atoms/cm$^3$, preferably lower than or equal to $5\times10^{19}$ atoms/an, further preferably lower than or equal to $1\times10^{19}$ atoms/cm$^3$, still further preferably lower than or equal to $5\times10^{18}$ atoms/cm$^3$. It is preferable to reduce the concentration of nitrogen in the base insulating film in order to reduce the concentration of nitrogen in the oxide semiconductor film. The concentration of nitrogen in the base insulating film measured by SIMS is set to be lower than $5\times10^{19}$ atoms/cm$^3$, preferably lower than or equal to $5\times10^{19}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the gate insulating film in order to reduce the concentration of hydrogen in the oxide semiconductor film. The concentration of hydrogen in the gate insulating film measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable reduce the concentration of nitrogen in the gate insulating film in order to reduce the concentration of nitrogen in the oxide semiconductor film. The concentration of nitrogen in the gate insulating film measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

A structure of an oxide semiconductor film that can be used as the oxide semiconductor film 404b is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) layer, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a shape that reflects a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

In this specification, the trigonal and rhombohedral crystal systems are included in the hexagonal crystal system.

On the other hand, when the CAAC-OS film is analyzed by an in-plane method in which an X-ray enters a sample in a direction substantially perpendicular to the c-axis, a peak appears frequently when $2\theta$ is around 56°. This peak is derived front the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, in the case where crystal growth leading to the CAAC-OS film occurs from the vicinity of the top surface of the layer, the degree of the crystallinity in the vicinity of the top surface is higher than that in the vicinity of the formation surface in some cases. Furthermore, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film with low impurity concentration. The impurity means an element other than the main components of the oxide semiconductor film, such as hydrogen, carbon, silicon, or a transition metal element. In particular, an element (e.g., silicon) that has higher bonding strength with oxygen than a metal element included in the oxide semiconductor film causes disorder of atomic arrangement in the oxide semiconductor film because the element deprives the oxide semiconductor film of oxygen, thereby reducing crystallinity. Furthermore, a heavy metal such as iron or nickel, argon, carbon dioxide, and the like have a large atomic radius (or molecular radius); therefore, when any of such elements is contained in the oxide semiconductor film, the element causes disorder of the atomic arrangement of the oxide semiconductor film, thereby reducing crystallinity. Note that the impurity contained in the oxide semiconductor film might become a carrier trap or a carrier generation source.

The CAAC-OS film is an oxide semiconductor film with a low density of defect states. For example, oxygen vacancies in the oxide semiconductor film serve as carrier traps or serve as carrier generation sources when hydrogen is trapped therein.

The state in which impurity concentration is low and density of defect states is low (the number of oxygen vacancies is small) is referred to as a "highly purified intrinsic" or "substantially highly purified intrinsic" state. A highly-purified intrinsic or substantially highly-purified intrinsic oxide semiconductor film has few carrier generation sources, and thus can have a low carrier density. Thus, a transistor using the oxide semiconductor film rarely has a negative threshold voltage (rarely has normally-on characteristics). A highly-purified intrinsic or substantially highly-purified intrinsic oxide semiconductor film has few carrier traps. Accordingly, the transistor using the oxide semiconductor film has a small change in electrical characteristics and high reliability. Note that charges trapped in the carrier traps in the oxide semiconductor film take a long time to be released and may behave like fixed charges. Thus, the transistor using the oxide semiconductor film with a high impurity concentration and a high density of defect states has unstable electrical characteristics in some cases.

In a transistor using the CAAC-OS film, change in electrical characteristics due to irradiation with visible light or ultraviolet light is small.

Next, a microcrystalline oxide semiconductor film is described.

In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 ran is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more layers of an amorphous oxide semiconductor film, a microcrystalline oxide semiconductor film, and a CAAC-OS film, for example.

For the oxide semiconductor film 404$b$, the above description of the oxide semiconductor film can be referred to. The oxide semiconductor films 404$a$ and 404$c$ include one or more elements other than oxygen included in the oxide semiconductor film 404$b$. Since the oxide semiconductor films 404$a$ and 404$c$ each include one or more elements other than oxygen included in the oxide semiconductor film 404$b$, an interface state is less likely to be formed at the interface between the oxide semiconductor films 404$a$ and 404$b$ and the interface between the oxide semiconductor films 404$b$ and 404$c$.

In the case of using an In-M-Zn oxide as the oxide semiconductor film 404$a$, when Zn and O are not taken into consideration, the proportion of In and the proportion of M are preferably set to be less than 50 atomic % and greater than or equal to 50 atomic %, respectively, further preferably less than 25 atomic % and greater than or equal to 75 atomic %, respectively. In the case of using an In-M-Zn oxide as the oxide semiconductor 404$b$, when Zn and O are not taken into consideration, the proportion of In and the proportion of M are preferably set to be greater than or equal to 25 atomic % and less than 75 atomic %, respectively, further preferably greater than or equal to 34 atomic % and less than 66 atomic %, respectively. In the case of using an In-M-Zn oxide as the oxide semiconductor film 404$c$, when Zn and O are not taken into consideration, the proportion of In and the proportion of M are preferably set to be less than 50 atomic % and greater than or equal to 50 atomic %, respectively, further preferably less than 25 atomic % and greater than or equal to 75 atomic %, respectively. Note that the oxide semiconductor film 404$c$ may be an oxide that is a type the same as that of the oxide semiconductor film 404$a$.

Here, in some cases, there is a mixed region of the oxide semiconductor films 404$a$ and 404$b$ between the oxide semiconductor films 404$a$ and 404$b$. Further, in some cases, there is a mixed region of the oxide semiconductor films 404$b$ and 404$c$ between the oxide semiconductor films 404$b$ and 404$c$. The mixed region has a low interface state density. For that reason, the stack of the oxide semiconductor films 404$a$, 404$b$, and 404$c$ has a band structure where energy at each interface and in the vicinity of the interface is changed continuously (continuous junction).

As the oxide semiconductor film 404$b$, an oxide having an electron affinity higher than those of the oxide semiconductor films 404$a$ and 404$c$ is used. For example, as the oxide semiconductor film 404$b$, an oxide having an electron affinity higher than those of the oxide semiconductor films 404$a$ and 404$c$ by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

At this time, when an electric field is applied to the gate electrode 410, a channel is formed in the oxide semiconductor film 404$b$ having the highest electron affinity in the oxide semiconductor films 404$a$, 404$b$, and 404$c$.

Moreover, the thickness of the oxide semiconductor film 404$c$ is preferably as small as possible to increase the on-state current of the transistor. The thickness of the oxide semiconductor film 404$c$ is set to be less than 10 nm, preferably less than or equal to 5 nm, further preferably less than or equal to 3 nm, for example. Meanwhile, the oxide semiconductor film 404$c$ has a function of blocking elements other than oxygen (such as silicon) included in the gate insulating film 408 from entering the oxide semiconductor film 404$b$ where a channel is formed. For this reason, it is preferable that the oxide semiconductor film 404$c$ have a certain thickness. The thickness of the oxide semiconductor film 404$c$ is set to be greater than or equal to 0.3 nm, preferably greater than or equal to 1 nm, further preferably greater than or equal to 2 nm, for example.

To improve reliability, preferably the thickness of the oxide semiconductor film 404$a$ is large and the thickness of the oxide semiconductor film 404$c$ is small. Specifically, the thickness of the oxide semiconductor film 404$a$ is set to be greater than or equal to 20 nm, preferably greater than or equal to 30 nm, further preferably longer than or equal to 40 nm, still further preferably greater than or equal to 60 nm. With the oxide semiconductor film 404$a$ having a thickness greater than or equal to 20 nm, preferably greater than or equal to 30 nm, further preferably longer than or equal to 40 nm, still further preferably greater than or equal to 60 nm, the distance from the interface between the base insulating film 402 and the oxide semiconductor film 404$a$ to the oxide semiconductor film 404$h$ where the channel is formed can be greater than or equal to 20 nm, preferably greater than or equal to 30 nm, further preferably longer than or equal to 40 nm, still further preferably greater than or equal to 60 nm. Note that since the productivity of a semiconductor device might be reduced, the thickness of the oxide semiconductor film 404a is set to be less than or equal to 200 nm, preferably less than or equal to 120 nm, further preferably less than or equal to 80 nm.

For example, the concentration of silicon in a region between the oxide semiconductor films 404b and 404a measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor films 404b and 404c measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$.

It is preferable to reduce the concentration of hydrogen in the oxide semiconductor films 404a and 404c in order to reduce the concentration of hydrogen in the oxide semiconductor film 404b. The concentration of hydrogen in the oxide semiconductor films 404a and 404c measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the oxide semiconductor films 404a and 404c in order to reduce the concentration of nitrogen in the oxide semiconductor film 404b. The concentration of nitrogen in the oxide semiconductor films 404a and 404c measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The above three-layer structure is an example. For example, a two-layer structure without the oxide semiconductor film 404a or 404c may be employed.

As the source electrode 406a and the drain electrode 406b, a conductive film capable of extracting oxygen from the oxide semiconductor film is preferably used. As an example of the conductive film capable of extracting oxygen from the oxide semiconductor film, a conductive film containing aluminum, titanium, chromium, nickel, molybdenum, tantalum, tungsten, or the like can be given.

By the conductive film capable of extracting oxygen from the oxide semiconductor film, oxygen in the oxide semiconductor film is released to form oxygen vacancies in the oxide semiconductor film in some cases. Oxygen is more likely to be extracted as the temperature is higher. Since the manufacturing process of the transistor involves some heat treatment steps, oxygen vacancies are likely to be formed in a region of the oxide semiconductor film, which is in contact with the source electrode or the drain electrode. Furthermore, hydrogen enters sites of oxygen vacancies by heating, and thus the oxide semiconductor film becomes n-type in some cases. Thus, due to the source electrode and the drain electrode, the resistance of a region where the oxide semiconductor film is in contact with the source electrode or the drain electrode is reduced, so that the on-state resistance of the transistor can be reduced.

In the case where a transistor with a short channel length less than or equal to 200 nm, or less than or equal to 100 nm) is manufactured, a source and a drain might be short-circuited due to formation of an n-type region. Therefore, in the case where a transistor with a short channel length is manufactured, a conductive film capable of appropriately extracting oxygen from an oxide semiconductor film may be used as the source electrode and the drain electrode. As the conductive film capable of appropriately extracting oxygen, a conductive film containing nickel, molybdenum, or tungsten can be used, for example.

Furthermore, in the case where a transistor with an extremely short channel length (less than or equal to 40 nm, or less than or equal to 30 nm) is manufactured, a conductive film that is less likely to extract oxygen from an oxide semiconductor film may be used as the source electrode 406a and the drain electrode 406b. As an example of the conductive film that is less likely to extract oxygen from an oxide semiconductor film, a conductive film containing tantalum nitride, titanium nitride, or ruthenium can be given. Note that plural kinds of conductive film may be stacked.

The gate electrode 410 may be formed using a conductive film containing one or more of aluminum, titanium, chromium, cobalt, nickel, copper, yttrium, zirconium, molybdenum, ruthenium, silver, tantalum, tungsten, and the like.

The oxide insulating film 412 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

High integration of a semiconductor device requires miniaturization of a transistor. However, it is known that miniaturization of a transistor causes deterioration of the electrical characteristics of the transistor. When a channel width is shortened, an on-state current is decreased.

However, in the transistor of one embodiment of the present invention, as described above, the oxide semiconductor film 404c is formed so as to cover a region where the channel is formed in the oxide semiconductor film 404b, and a channel formation layer and the gate insulating film are not in contact with each other. Accordingly, scattering of carriers at the interface between the channel formation layer and the gate insulating film can be reduced and the field-effect mobility of the transistor can be increased.

In the case where an oxide semiconductor film is an intrinsic or substantially intrinsic oxide semiconductor film, it is concerned that the field-effect mobility is decreased because of a reduction in the number of carriers in the oxide semiconductor film. However, in the transistor of one embodiment of the present invention, a gate electric field is applied to the oxide semiconductor film not only in the vertical direction but also from the side surfaces. That is, the gate electric field is applied to the whole of the oxide semiconductor film, whereby current flows in the bulk of the oxide semiconductor film. Consequently, it is possible to improve the field-effect mobility of a transistor and suppress variations in electrical characteristics of the transistor due to a highly purified intrinsic oxide semiconductor film.

In the transistor of one embodiment of the present invention, the oxide semiconductor film 404b is formed over the oxide semiconductor film 404a, so that an interface state is less likely to be formed. In addition, impurities do not enter the oxide semiconductor film 404b from above and below because the oxide semiconductor film 404b is an intermediate layer in a three-layer structure. With the structure in which the oxide semiconductor film 404b is electrically surrounded by the electric field of the gate electrode 410, the on-state current of the transistor is increased as described above, and in addition, a threshold voltage can be stabilized and an S value can be reduced. Thus, Icut (a drain current when a gate voltage is 0 V) can be reduced and power consumption can be reduced. Further, the threshold voltage of the transistor becomes stable; thus, long-term reliability of the semiconductor device can be improved.

Figure 3A:
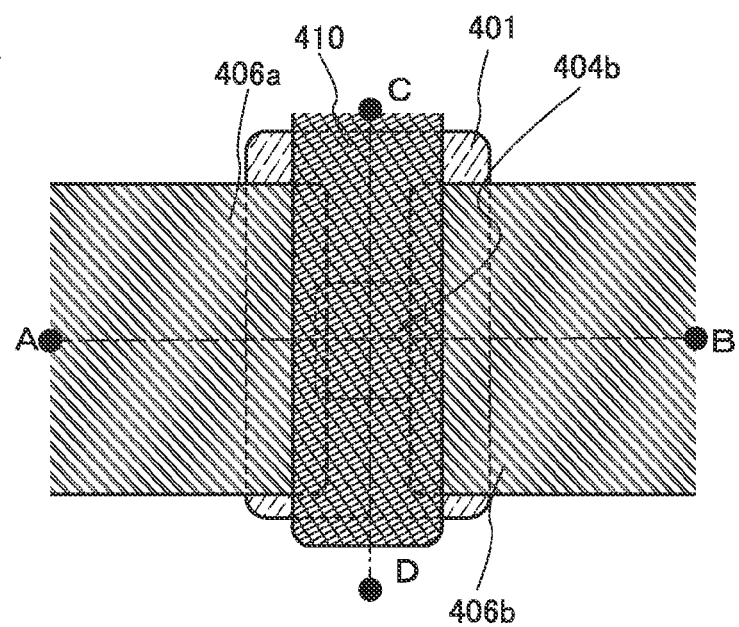
FIGS. 3A to 3C are a top view and cross-sectional views illustrating a transistor.
Figure 3B:
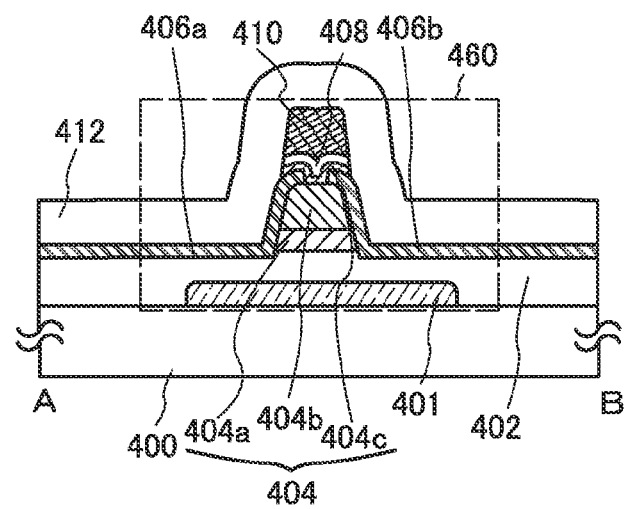
Figure 3C:
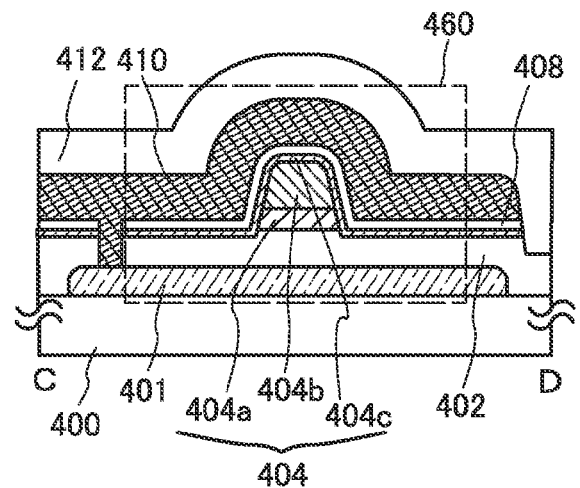

A transistor 460 illustrated in FIGS. 3A to 3C can be used. FIGS. 3A to 3C are a top view and cross-sectional views that illustrate the transistor 460. FIG. 3A is the top view. FIG. 3B illustrates a cross section taken along the dashed-dotted line A-B in FIG. 3A, FIG. 3C illustrates a cross section taken along the dashed-dotted line C-D in FIG. 3A. Note that for simplification of the drawing, some components in the top view in FIG. 3A are not illustrated.

In the transistor 460 illustrated in FIGS. 3A to 3C, a conductive film 401 is provided between the base insulating film 402 and the substrate 400. When the conductive film 401 is used as a second gate electrode, the on-state current can be further increased or the threshold voltage can be controlled. In order to increase the on-state current, for example, as illustrated in FIGS. 3A to 3C, the gate electrode 410 and the conductive film 401 are electrically connected to each other to have the same potential, and the transistor is driven as a dual-gate transistor. Alternatively, to control the threshold voltage, the gate electrode 410 and the conductive film 401 are not electrically connected to each other, so that a fixed potential, which is different from a potential of the gate electrode 410, is supplied to the conductive film 401.

Figure 4A:
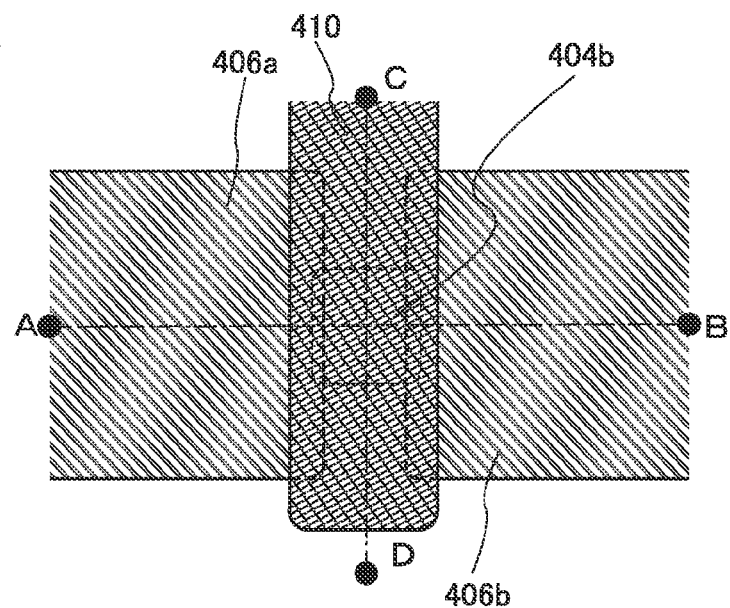
FIGS. 4A to 4C are a top view and cross-sectional views illustrating a transistor.
Figure 4B:
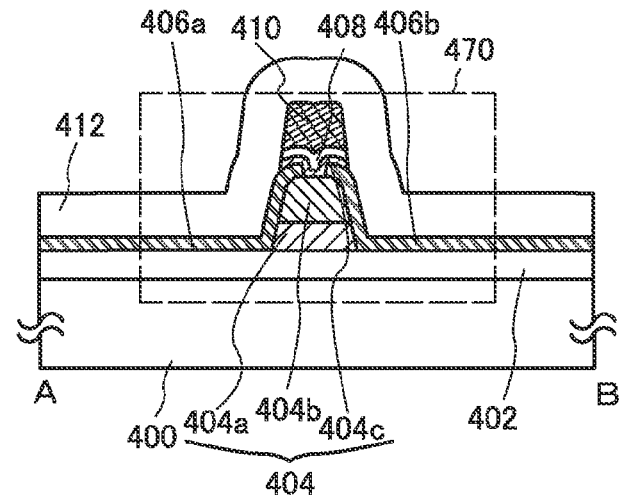
Figure 4C:
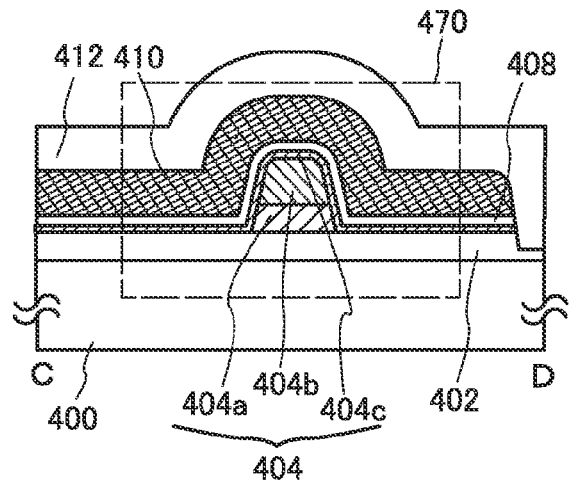

A transistor 470 illustrated in FIGS. 4A to 4C can be used. FIGS. 4A to 4C are a top view and cross-sectional views that illustrate the transistor 470. FIG. 4A is the top view. FIG. 4B illustrates a cross section taken along the dashed-dotted line A-B in FIG. 4A. FIG. 4C illustrates a cross section taken along the dashed-dotted line C-D in FIG. 4A. Note that for simplification of the drawing, some components in the top view in FIG. 4A are not illustrated.

In the transistor 470, overetching of the base insulating film 402 is suppressed when the oxide semiconductor films 404a and 404b are formed and thus the base insulating film 402 is not etched.

In order to prevent etching of the base insulating film 402 at the time of etching of oxide semiconductor films to be the oxide semiconductor films 404a and 404b, the selectivity ratio of the oxide semiconductor films to the base insulating film 402 is preferably set high.

Note that the conductive film 401 may be provided in FIGS. 4A to 4C as in FIGS. 3A to 3C.

Figure 5A:
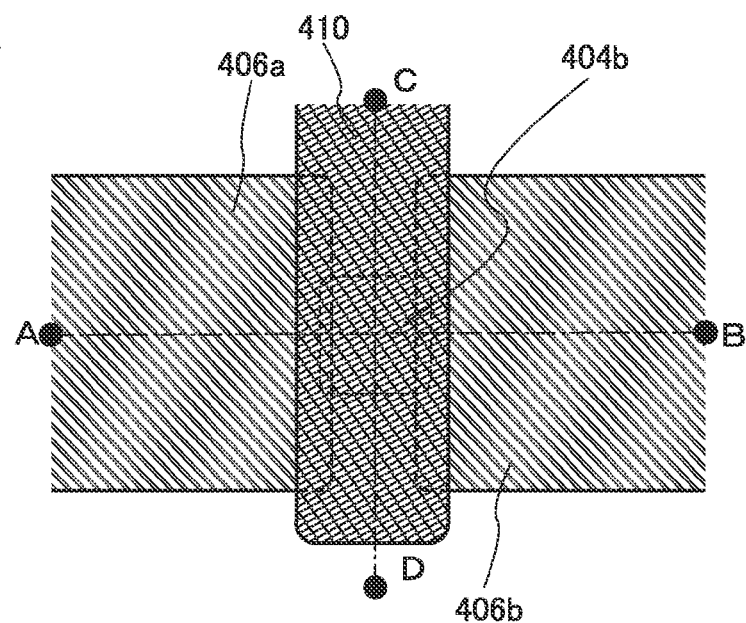
FIGS. 5A to 5C are a top view and cross-sectional views illustrating a transistor.
Figure 5B:
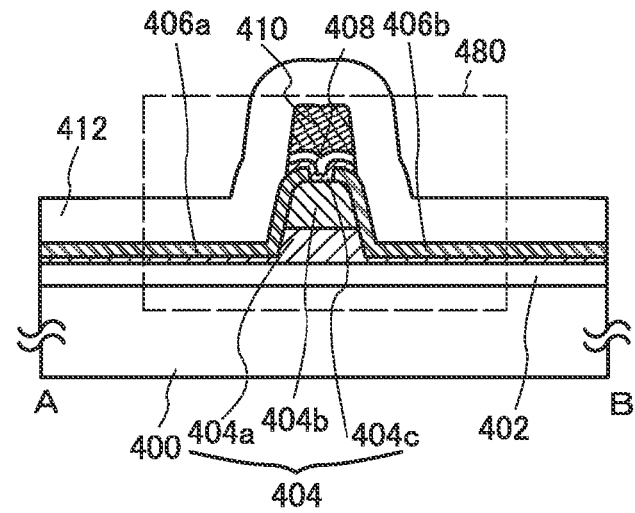
Figure 5C:
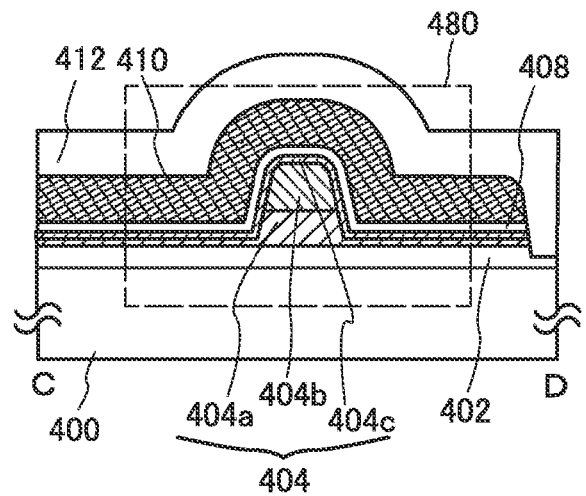

A transistor 480 illustrated in FIGS. 5A to 5C can be used. FIGS. 5A to 5C are a top view and cross-sectional views that illustrate the transistor 480. FIG. 5A is the top view. FIG. 5B illustrates a cross section taken along the dashed-dotted line A-B in FIG. 5A. FIG. 5C illustrates a cross section taken along the dashed-dotted line C-D in FIG. 5A. Note that for simplification of the drawing, some components are not illustrated in the top view of FIG. 5A.

In etching to form the oxide semiconductor films 404a and 404b of the transistor 480, the oxide semiconductor film 404a is not entirely etched, so that the oxide semiconductor film 404a has a projecting shape.

Note that the conductive film 401 may be provided in FIGS. 5A to 5C as in FIGS. 3A to 3C.

In this embodiment, the oxide semiconductor film 404b is sandwiched between the oxide semiconductor films 404a and 404c. However, the structure is not limited thereto; a structure without the oxide semiconductor film 404a or a structure with another oxide semiconductor film may be employed.

The electrode and the oxide semiconductor film may have angular end portions. The angular end portions can be obtained such that, when a film is processed using a resist mask or a hard mask, an etching selectivity ratio of the film to be processed to the resist mask or the hard mask is preferably set high.

This embodiment can be combined with any of the other embodiments in this specification as appropriate.

Embodiment 2

In this embodiment, a method for manufacturing the transistor 450, which is described in Embodiment 1 with reference to FIGS. 1A to 1C, is described with reference to FIGS. 6A to 6C and FIGS. 7A to 7C.

Figure 6A:
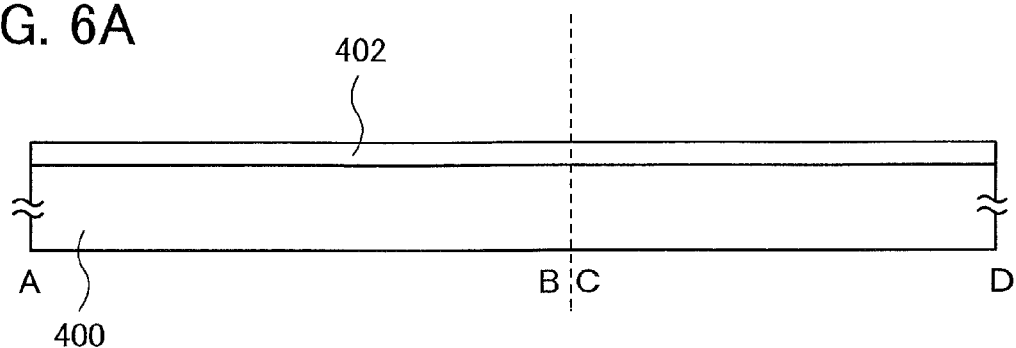
FIGS. 6A to 6C illustrate a method for manufacturing a transistor.

First, the base insulating film 402 is formed over the substrate 400 (see FIG. 6A).

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, carbide, or the like, a compound semiconductor substrate made of silicon germanium or the like, a silicon-on-insulator (SOI) substrate, or the like may be used. Still alternatively, any of these substrates further provided with a semiconductor element may be used.

The base insulating film 402 may be formed by a sputtering method, a chemical vapor deposition (CVD) method, a metal organic CVD (MOCVD) method, a plasma-enhanced CVD (PECVD) method, a molecular beam epitaxy (MBE) method, an atomic layer deposition (ALD) method, or a pulsed laser deposition (PLD) method. To reduce damage by plasma, MOCVD or ALD is preferably used.

Then, in order to planarize the surface of the base insulating film 402, CMP treatment may be performed. By CMP treatment, the base insulating film 402 has an average surface roughness ($R_a$) of less than 1 nm, preferably less than or equal to 0.3 nm, more preferably less than or equal to 0.1 nm. In some cases, $R_a$ that is less than or equal to the above value can increase the crystallinity of the oxide semiconductor film. $R_a$ can be measured using an atomic force microscope (AFM).

Then, oxygen may be added to the base insulating film 402 so that an insulating film containing excess oxygen can be formed. Oxygen may be added by plasma treatment, an ion implantation method, or the like. In the case where the addition of oxygen may be performed by an ion implantation method, the acceleration voltage may be higher than or equal to 2 kV and lower than or equal to 100 kV and the dose is greater than or equal to $5 \times 10^{14}$ ions/cm$^2$ and less than or equal to $5 \times 10^{16}$ ions/cm$^2$, for example.

In the case where a surface of the substrate 400 is made of an insulator and there is no influence of impurity diffusion to the multilayer film 404 to be formed later, the base insulating film 402 is not necessarily provided.

Figure 6B:
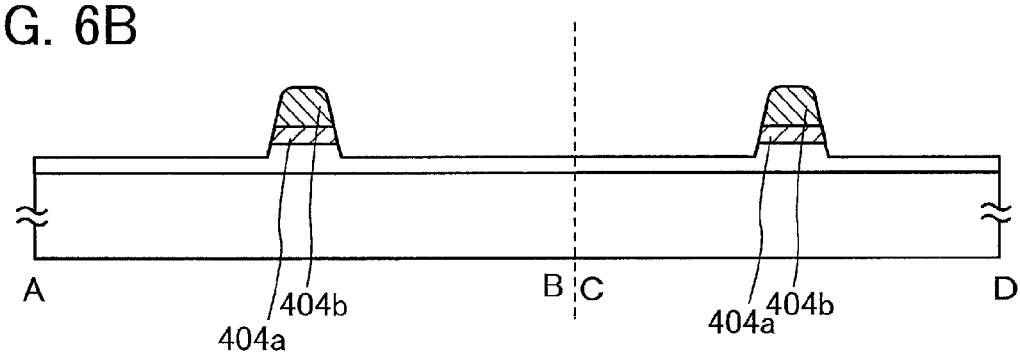

Next, the oxide semiconductor films 404a and 404b are formed over the base insulating film 402 by a sputtering method, a CVD method, an MOCVD method, a PECVD method, an MBE method, an ALD method, or a PLD method (see FIG. 6B). It is preferable to use an MOCVD method or an ALD method in order to reduce plasma damage. As shown in FIG. 6B, the base insulating film 402 may be appropriately etched. By appropriately etching the base insulating film 402, the gate electrode 410 to be formed later can cover the multi layer film 404 easily.

For processing the oxide semiconductor films 404a and 404b into island shapes, first, a film to be a hard mask (e.g., a tungsten film) and a resist mask are provided over the oxide semiconductor film 404b, and the film to be a hard mask is etched to form a hard mask. Then, the resist mask is removed, and etching of the oxide semiconductor films 404a and 404b is performed using the hard mask, which is followed by removal of the hard mask. At the time of the etching, an end portion of the hard mask is gradually reduced as the etching progresses; as a result, the end portion of the hard mask is rounded to have a curved surface in some cases. Accordingly, the end portion of the oxide semiconductor film 404b is rounded to have a curved surface in some cases. With this structure, the coverage with the gate insulating film 408, the gate electrode 410, and the oxide insulating film 412, which are to be formed over the oxide semiconductor film 404b, can be improved; thus, occurrence of a shape defect such as disconnection can be inhibited, in addition, electric field concentration that might occur at the end portions of the source electrode 406a and the drain electrode 406b can be reduced, which can suppress deterioration of the transistor.

In order to form a continuous energy band in a stack including the oxide semiconductor films 404a and 404b, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $0.5 \times 10^{-7}$ Pa to $1 \times 10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an evacuation system into the chamber.

Not only high vacuum evacuation of the chamber but also high purity of a sputtering gas is necessary to obtain a highly purified intrinsic oxide semiconductor. An oxygen gas or an argon gas used as the sputtering gas is highly purified to have a dew point of −40° C. or lower, preferably −80° C. or lower, further preferably −100° C. or lower, so that entry of moisture and the like into the oxide semiconductor film can be prevented as much as possible. The state in which impurity concentration is low and density of defect states is low (the number of oxygen vacancies is small) is referred to as "highly purified intrinsic" or "substantially highly purified intrinsic".

First heat treatment may be performed after the oxide semiconductor film 404b is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor film 404b can be improved, and in addition, impurities such as hydrogen and water can be removed from the base insulating film 402.

Figure 6C:
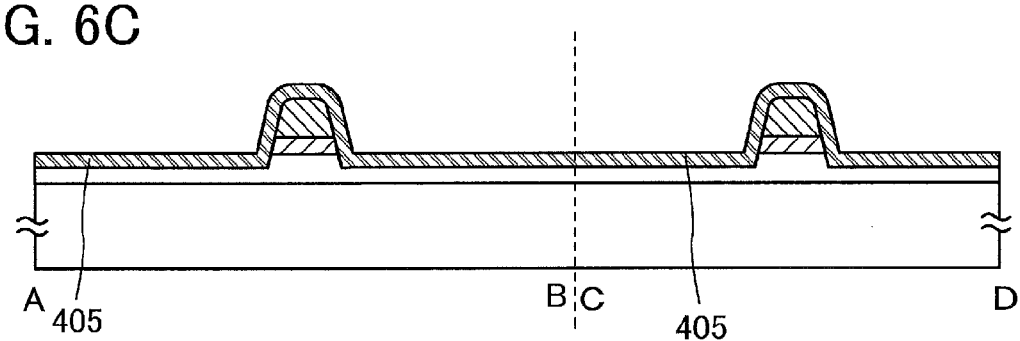

Next, a first conductive film 405 to be the source electrode 406a and the drain electrode 406b is formed over the oxide semiconductor films 404a and 404b (see FIG. 6C). The first conductive film 405 can be deposited by a sputtering method, a CVD method, an MOCVD method, a PECVD method, an MBE method, an ALD method, or a PLD method. To reduce damage by plasma, MOCVD or ALD is preferably used.

Figure 7A:
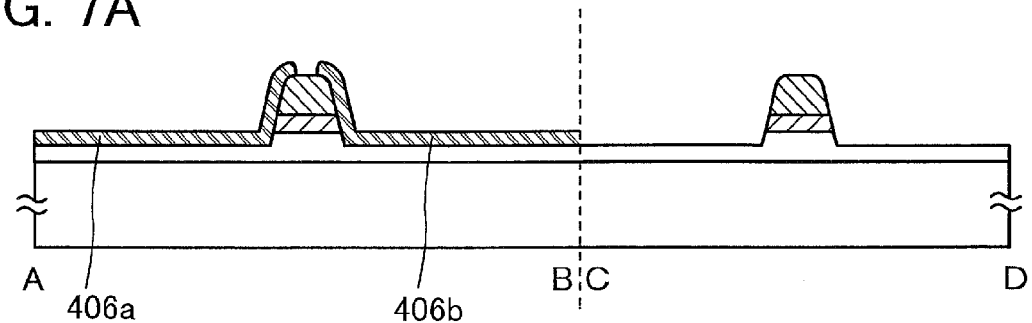
FIGS. 7A to 7C illustrate a method for manufacturing a transistor.

Next, the first conductive film 405 is divided by etching to form the source electrode 406a and the drain electrode 406b (see FIG. 7A). Note that when the first conductive film 405 is etched, end portions of the source electrode 406a and the drain electrode 406b are rounded (have curved surfaces) in some cases. The base insulating film 402 may be further etched in the C-D direction than in the A-B direction by the etching of the first conductive film 405.

Next, the oxide semiconductor film 404c is formed over the oxide semiconductor film 404b, the source electrode 406a, and the drain electrode 406b.

Note that second heat treatment may be performed after the oxide semiconductor film 404c is formed. The second heat treatment can be performed in a condition similar to that of the first heat treatment. The second heat treatment can remove impurities such as hydrogen and water from the oxide semiconductor film 404c. In addition, impurities such as hydrogen and water can be further removed from the oxide semiconductor films 404a and 404b.

Figure 7B:
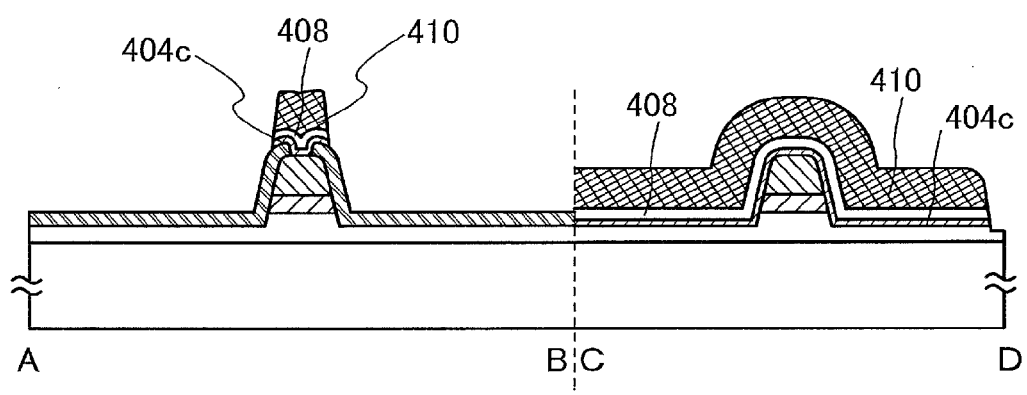

Next, the gate insulating film 408 is formed over the oxide semiconductor film 404c, the source electrode 406a, and the drain electrode 406b, and the gate electrode 410 is formed over the gate insulating film 408 (see FIG. 7B). Note that the electric field of the gate electrode 410 is formed so as to electrically cover the oxide semiconductor film 404b.

Figure 7C:
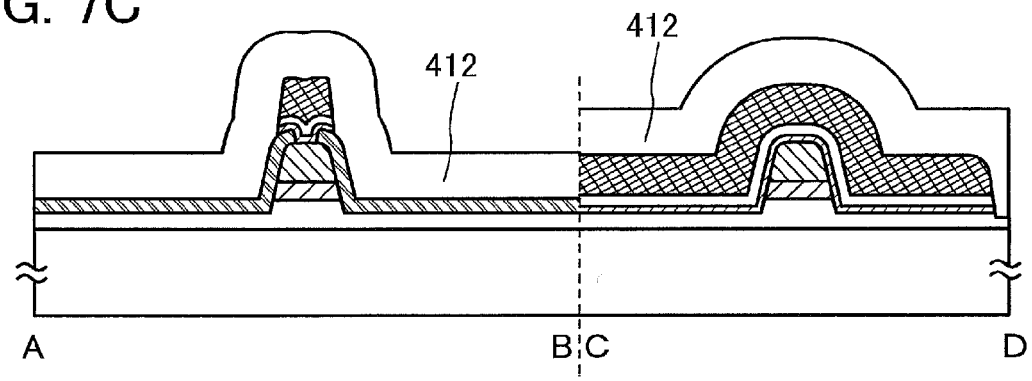

Next, the oxide insulating film 412 is formed over the source electrode 406a, the drain electrode 406b, and the gate electrode 410 (see FIG. 7C). The oxide insulating film 412 can be deposited by a sputtering method, a CVD method, an MOCVD method, a PECVD method, an MBE method, an ALD method, or a PLD method. To reduce damage by plasma, MOCVD or ALD is preferably used.

After that, third heat treatment may be performed. The third heat treatment can be performed in a condition similar to that of the first heat treatment. The third heat treatment allows reducing oxygen vacancies in the oxide semiconductor film 404b in some cases.

Through the above process, the transistor 450 illustrated in FIGS. 1A to 1C can be manufactured.

This embodiment can be combined with any of the other embodiments in this specification as appropriate.

Embodiment 3

In this embodiment, a transistor having a structure different from those of the transistors described in the above embodiments is described.

Figure 8A:
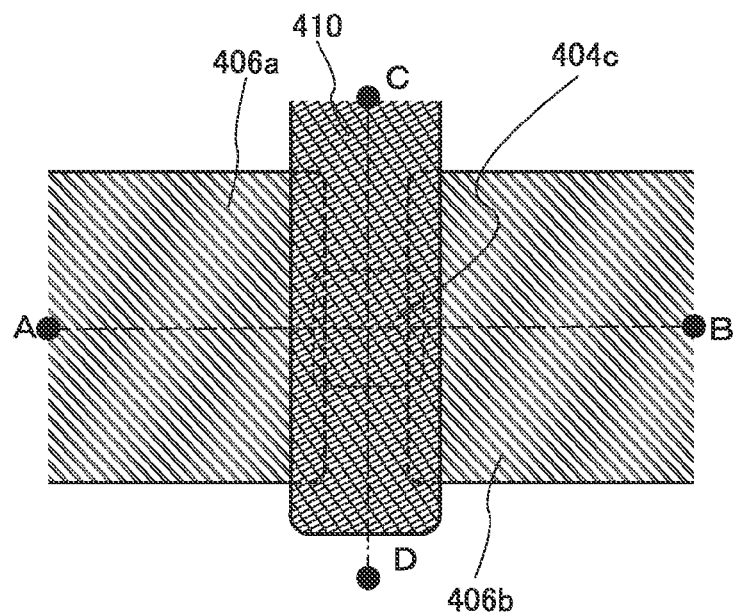
FIGS. 8A to 8C are a top view and cross-sectional views illustrating a transistor.
Figure 8B:
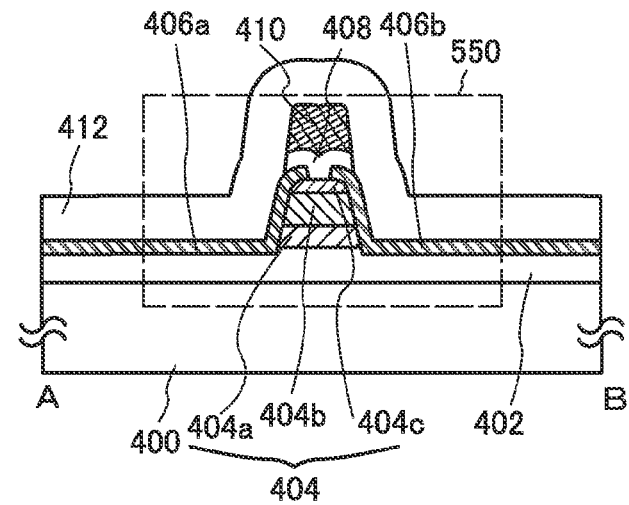
Figure 8C:
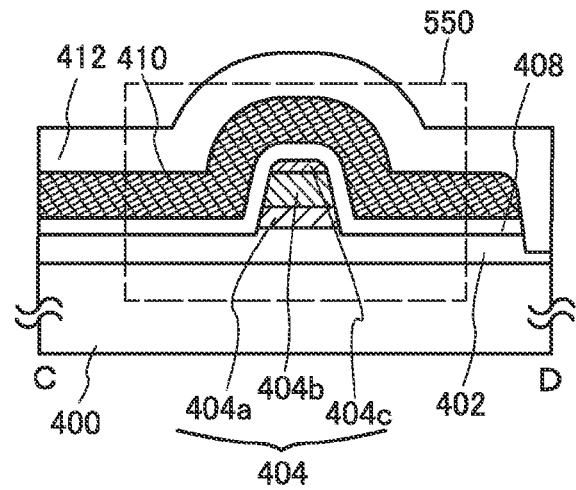

FIGS. 8A to 8C are a top view and cross-sectional views illustrating a transistor of one embodiment of the present invention. FIG. 8A is the top view. FIG. 8B illustrates a cross section taken along the dashed-dotted line A-B in FIG. 8A. FIG. 8C illustrates a cross section taken along the dashed-dotted line C-D in FIG. 8A. Note that for simplification of the drawing, some components in the top view in FIG. 8A are not illustrated. In some cases, the direction of the dashed-dotted line A-B is referred to as a channel length direction, and the direction of the dashed-dotted line C-D is referred to as a channel width direction.

A transistor 550 illustrated in FIGS. 8A to 8C includes the base insulating film 402 having a projecting portion over the substrate 400; the oxide semiconductor films 404a, 404b, and 404c over the projecting portion of the base insulating film 402; the source electrode 406a and the drain electrode 406b each in contact with side surfaces of the oxide semiconductor films 404a, 404b, and 404c and the top surface of the oxide semiconductor film 404c; the gate insulating film 408 over the oxide semiconductor film 404c, the source electrode 406a, and the drain electrode 406b; the gate electrode 410 that is in contact with the top surface of the gate insulating film 408 and faces the top and side surfaces of the oxide semiconductor film 404b; and the oxide insulating film 412 over the source electrode 406a, the drain electrode 406b, and the gate electrode 410. Furthermore, the oxide semiconductor films 404a, 404b, and 404c are collectively referred to as the multilayer film 404.

As described in Embodiment 1, the length obtained by subtracting the length (corresponding to L1 in Embodiment 1) between the source electrode 406a and the drain electrode 406b from the length (corresponding to L2 in Embodiment 1) of the oxide semiconductor film 404b in the channel length direction is preferably 0.2 times to 2.0 times, more preferably 0.5 times to 2.0 times, as long as the length between the source electrode 406a and the drain electrode 406b. With that range, the values of the characteristics of a transistor hardly changes; thus, variations in electrical characteristics of the transistor can be reduced and high reliability can be obtained.

Furthermore, with that range, the length obtained by subtracting the length between the source electrode 406a and the drain electrode 406b from the length of the oxide semiconductor film 404b in the channel length direction is preferably longer than or equal to 30 nm and shorter than or equal to 60 nm, more preferably longer than or equal to 40 nm and shorter than or equal to 50 nm.

Note that a channel length refers to a distance between a source (a source region or a source electrode) and a drain (a drain region or a drain electrode) in a region where a semiconductor film and a gate electrode overlap with each other in a top view. In other words, the channel length seen in FIG. 8A indicates a distance between the source electrode 406a and the drain electrode 406b in a region where the oxide semiconductor film 404b and the gate electrode 410 overlap with each other. A channel width refers to the width of a source or a drain in a region where a semiconductor film and a gate electrode overlap with each other. Accordingly, in FIG. 8A, the channel width is the width of the source electrode 406a or the drain electrode 406b in the region where the oxide semiconductor film 404b and the gate electrode 410 overlap with each other.

In fabricating a transistor with a small channel length and a small channel width, when an electrode, a semiconductor film, or the like is processed while a resist mask is reduced in size, the electrode, the semiconductor film, or the like has around end portion (curved surface) in some cases. With this structure, the coverage with the gate insulating film 408, the gate electrode 410, and the oxide insulating film 412, which are to be formed over the oxide semiconductor film 404b, can be improved. In addition, electric field concentration that might occur at end portions of the source electrode 406a and the drain electrode 406b can be reduced, which can suppress deterioration of the transistor.

Miniaturization of a transistor leads to high integration and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm. The transistor of one embodiment of the present invention has an s-channel structure. Therefore, even when the channel width is shortened to the above range, a high on-state current can be obtained.

The electric field of the gate electrode 410 electrically surrounds the oxide semiconductor film 404b, whereby the on-state current is increased. Note that in the s-channel structure, current flows in the whole of the oxide semiconductor film 404b. When current flows in an inner part of the oxide semiconductor film 404b, the current is hardly affected by interface scattering, leading to a high on-state current. Note that when the oxide semiconductor film 404b is thick, the on-state current can be further increased. Furthermore, the gate electrode 410 extending lower than the interface between the oxide semiconductor films 404a and 404b toward the base insulating film 102 side does not affect the channel width. Thus, the channel width can be reduced, achieving high density (high integration).

Figure 9A:
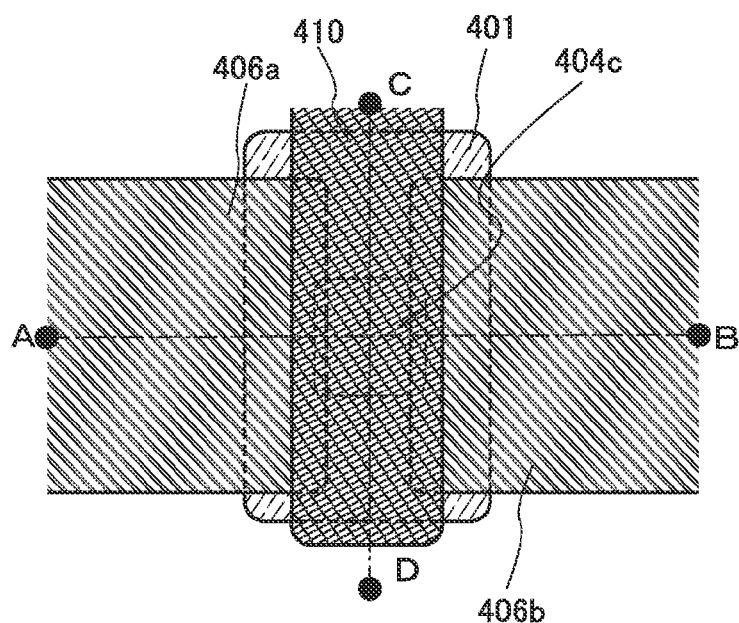
FIGS. 9A to 9C are a top view and cross-sectional views illustrating transistor.
Figure 9B:
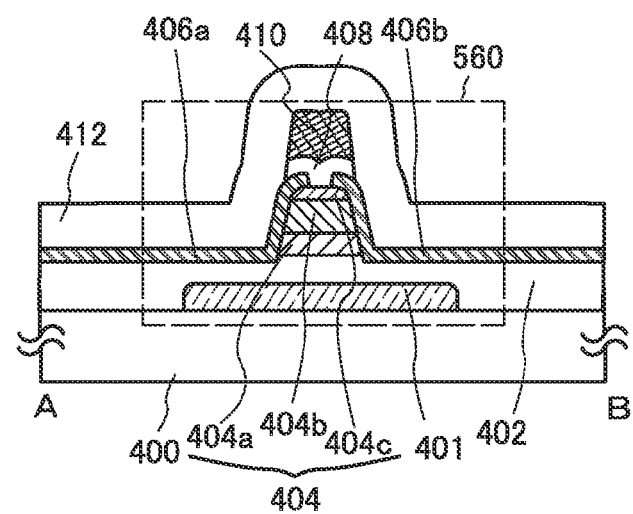
Figure 9C:
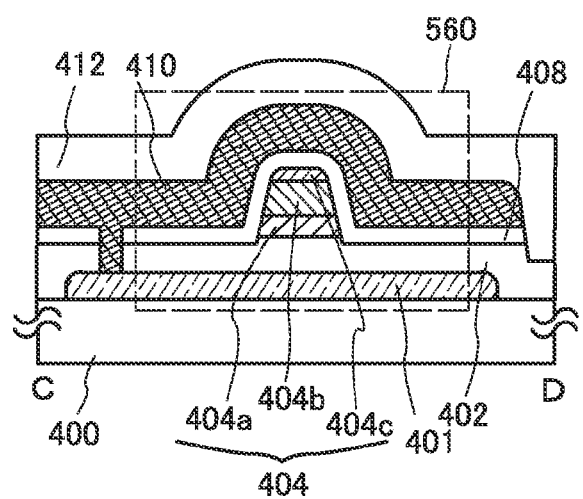

A transistor 560 illustrated in FIGS. 9A to 9C can be used. FIGS. 9A to 9C are a top view and cross-sectional views illustrating the transistor 560. FIG. 9A is the top view. FIG. 9B illustrates a cross section taken along dashed-dotted line A-B in FIG. 9A. FIG. 9C illustrates a cross section taken along dashed-dotted line C-D in FIG. 9A. Note that for simplification of the drawing, some components are not illustrated in the top view in FIG. 9A.

In the transistor 560 illustrated in FIGS. 9A to 9C, a conductive film 401 is provided between the base insulating film 402 and the substrate 400. When the conductive film 401 is used as a second gate electrode, the on-state current can be further increased or the threshold voltage can be controlled. In order to increase the on-state current, for example, as illustrated in FIGS. 9A to 9C, the gate electrode 410 and the conductive film 401 are electrically connected to each other to have the same potential, and the transistor is driven as a dual-gate transistor. Alternatively, to control the threshold voltage, the gate electrode 410 and the conductive film 401 are not electrically connected to each other, so that a fixed potential, which is different from a potential of the gate electrode 410, is supplied to the conductive film 401.

Figure 10A:
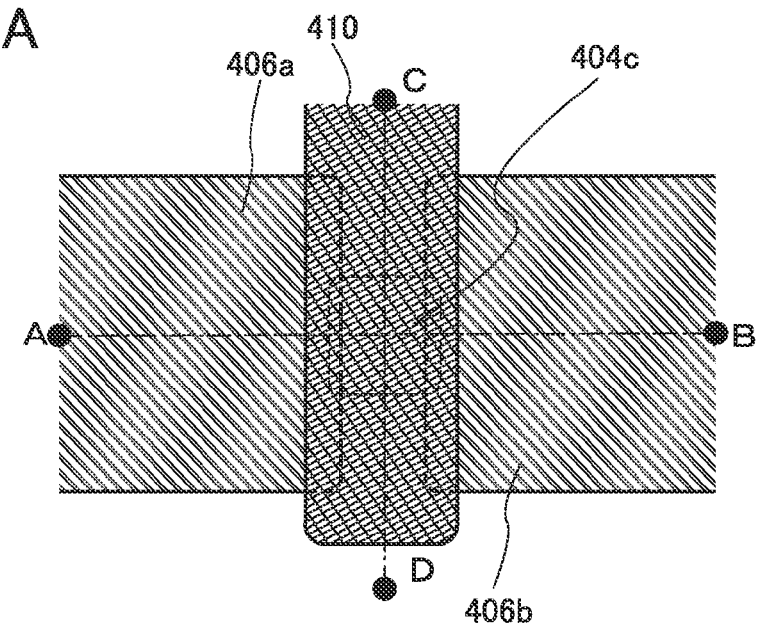
FIGS. 10A to 10C are a top view and cross-sectional views illustrating a transistor.
Figure 10B:
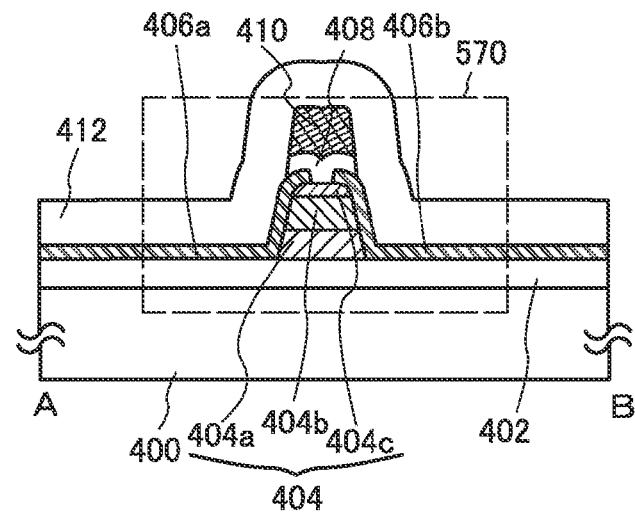
Figure 10C:
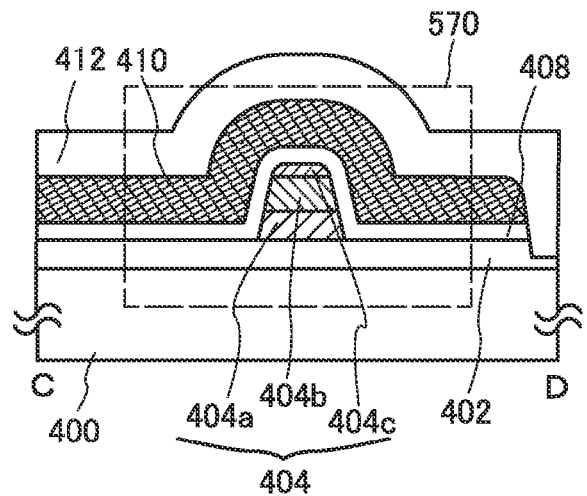

A transistor 570 illustrated in FIGS. 10A to 10C can be used. FIGS. 10A to 10C are a top view and cross-sectional views illustrating the transistor 570. FIG. 10A is the top view. FIG. 10B illustrates a cross section taken along dashed-dotted line A-B in FIG. 10A. FIG. 10C illustrates a cross section taken along dashed-dotted line C-D in FIG. 10A. Note that for simplification of the drawing, some components are not illustrated in the top view in FIG. 10A.

In the transistor 570, overetching of the base insulating film 402 is suppressed when the oxide semiconductor films 404a, 404b, and 404c are formed and thus the base insulating film 402 is not etched.

In order to prevent etching of the base insulating film 402 at the time of etching of oxide semiconductor films to be the oxide semiconductor films 404a and 404b, the selectivity ratio of the oxide semiconductor films to the base insulating film 402 is preferably set high.

Note that the conductive film 401 may be provided in FIGS. 10A to 10C as in FIGS. 9A to 9C.

Figure 11A:
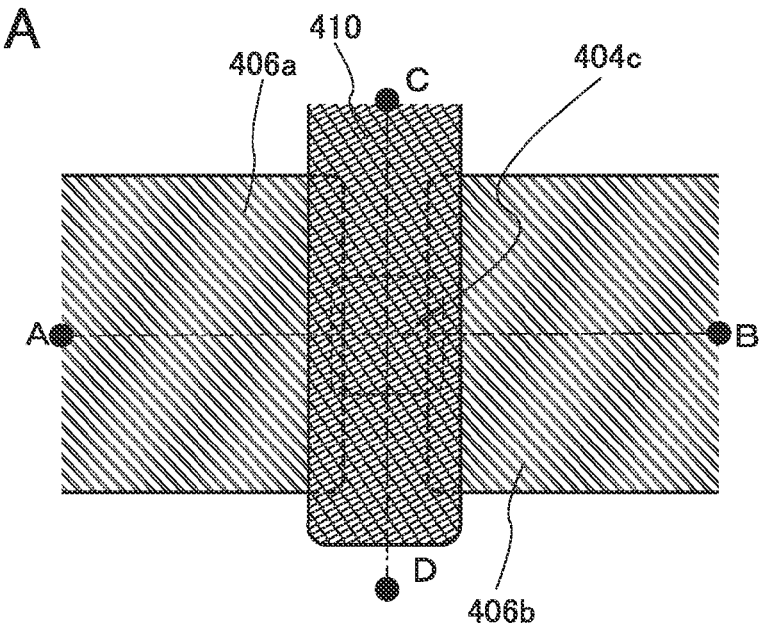
FIGS. 11A to 11C are a top view and cross-sectional views illustrating a transistor.
Figure 11B:
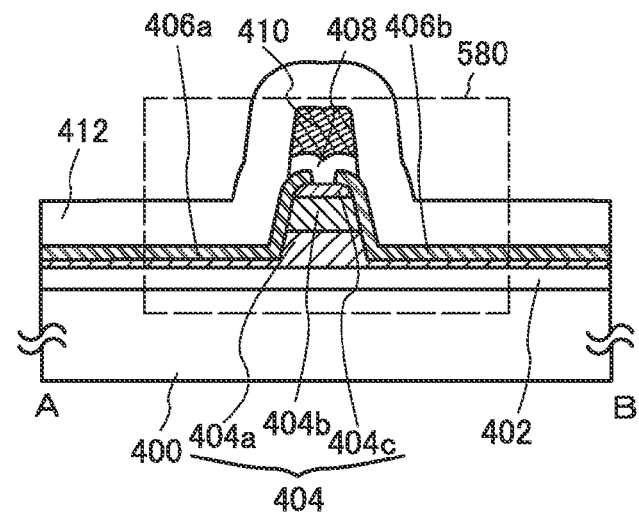
Figure 11C:
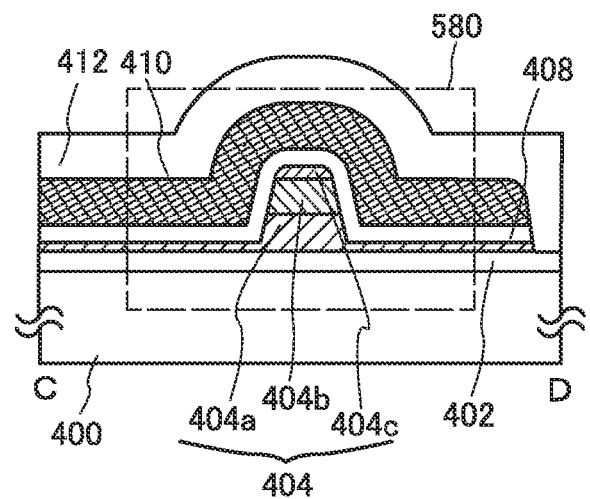

A transistor 580 illustrated in FIGS. 11A to 11C can be used. FIGS. 11A to 11C are a top view and cross-sectional views illustrating the transistor 580. FIG. 11A is the top view. FIG. 11B illustrates a cross section taken along dashed-dotted line A-B in FIG. 11A. FIG. 11C illustrates a cross section taken along dashed-dotted line C-D in FIG. 11A. Note that for simplification of the drawing, some components are not illustrated in the top view of FIG. 11A.

In etching to form the oxide semiconductor films 404a, 404b, and 404c of the transistor 580, the oxide semiconductor film 404a is not entirely etched, so that the oxide semiconductor film 404a has a projecting shape.

Note that the conductive film 401 may be provided in FIGS. 11A to 11C as in FIGS. 9A to 9C.

In this embodiment, the oxide semiconductor film 404b is sandwiched between the oxide semiconductor films 404a and 404c. However, the structure is not limited thereto; a structure without the oxide semiconductor film 404a or a structure with another oxide semiconductor film may be employed.

The electrode and the oxide semiconductor film may have angular end portions. In order to obtain the angular end portions, when a film is processed using a resist mask or a hard mask, the selectivity ratio of the film to be processed to the resist mask or the hard mask is preferably set high.

This embodiment can be combined with any of the other embodiments in this specification as appropriate.

Embodiment 4

In this embodiment, a method for manufacturing the transistor 550 described in Embodiment 3 with reference to FIGS. 8A to 8C is described with reference to FIGS. 12A to 12C and FIGS. 13A to 13C.

Figure 12A:
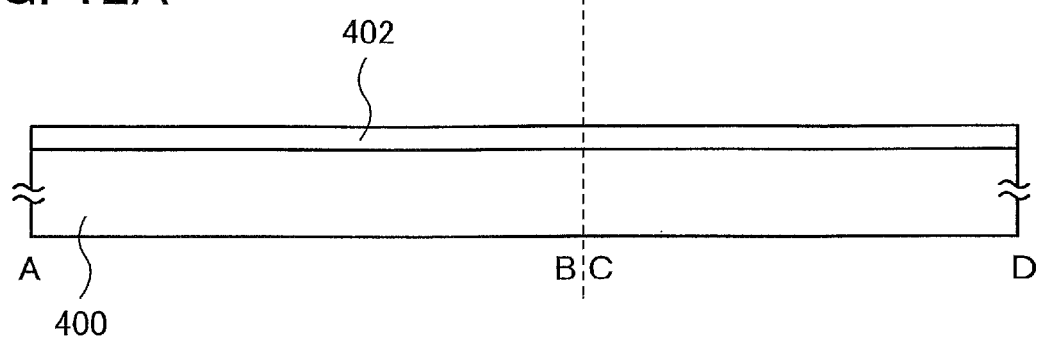
FIGS. 12A to 12C illustrate a method for manufacturing a transistor.

First, the base insulating film 402 is formed over the substrate 400 (see FIG. 12A). The above embodiments can be referred to for a material and a formation method of the base insulating film 402.

Figure 12B:
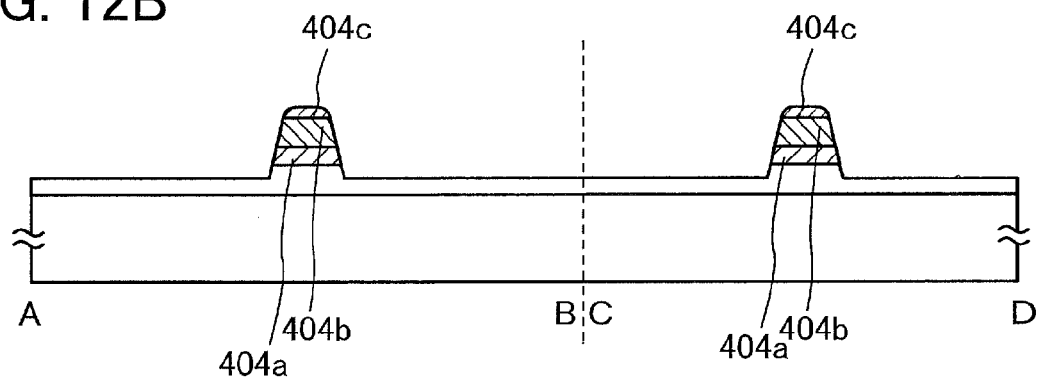

Next, the oxide semiconductor films 404a, 404b, and 404c are formed over the base insulating film 402 (see FIG. 12B). The above embodiments can be referred to for materials and formation methods of the oxide semiconductor films 404a to 404e.

Figure 12C:
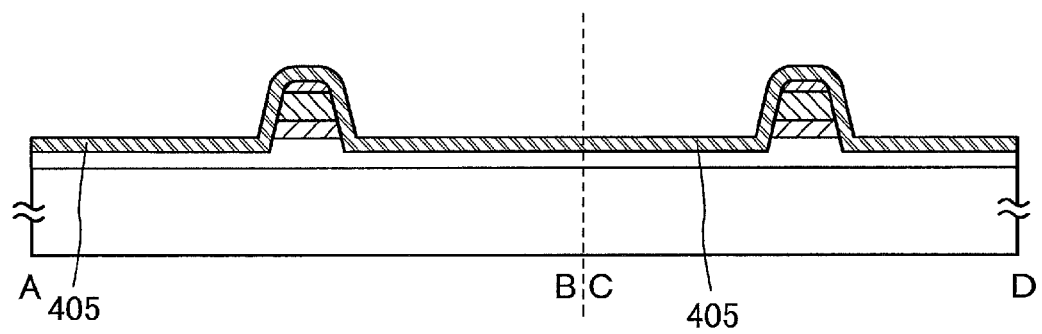

Then, the first conductive film 405 to be the source electrode 406a and the drain electrode 406b is formed over the oxide semiconductor films 404a, 404b, and 404c (see FIG. 12C). The above embodiments can be referred to for a material and a formation method of the first conductive film 405.

Figure 13A:
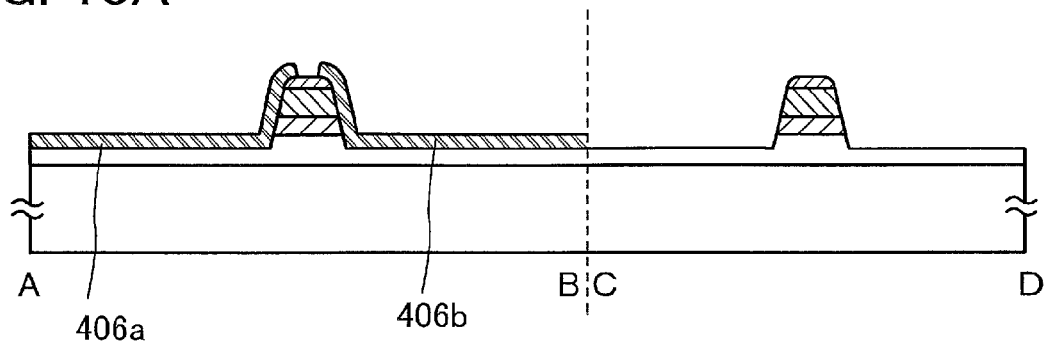
FIGS. 13A to 13C illustrate a method for manufacturing a transistor.

Next, the first conductive film 405 is divided by etching to form the source electrode 406a and the drain electrode 406b (see FIG. 13A). Note that when the first conductive film 405 is etched, end portions of the source electrode 406a and the drain electrode 406b are rounded (have curved surfaces) in some cases. The base insulating film 402 may be further etched in the C-D direction than in the A-B direction by the etching of the first conductive film 405.

Figure 13B:
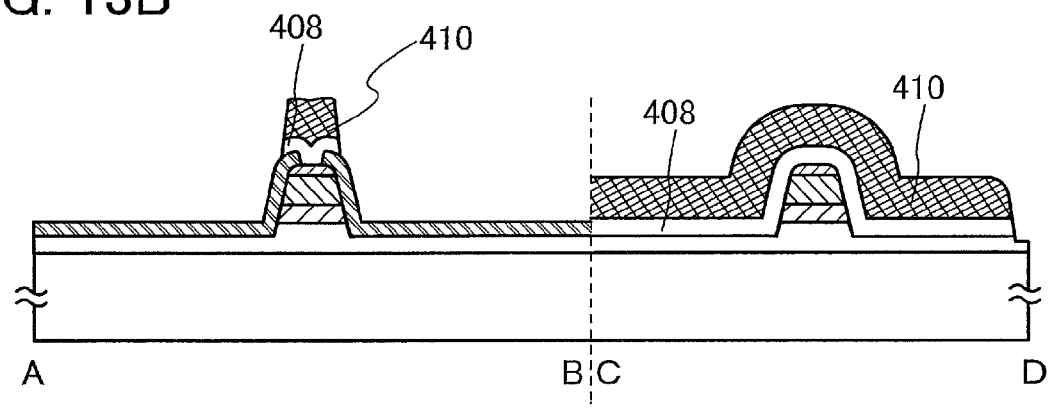

Subsequently, the gate insulating film 408 is formed over the oxide semiconductor film 404c, the source electrode 406a, and the drain electrode 406b, and the gate electrode 410 is formed over the gate insulating film 408 (see FIG. 13B). Note that the oxide semiconductor film 404b is electrically surrounded by the electric field of the gate electrode 410. The above embodiments can be referred to for the materials and formation methods of the gate insulating film 408 and the gate electrode 410.

Figure 13C:
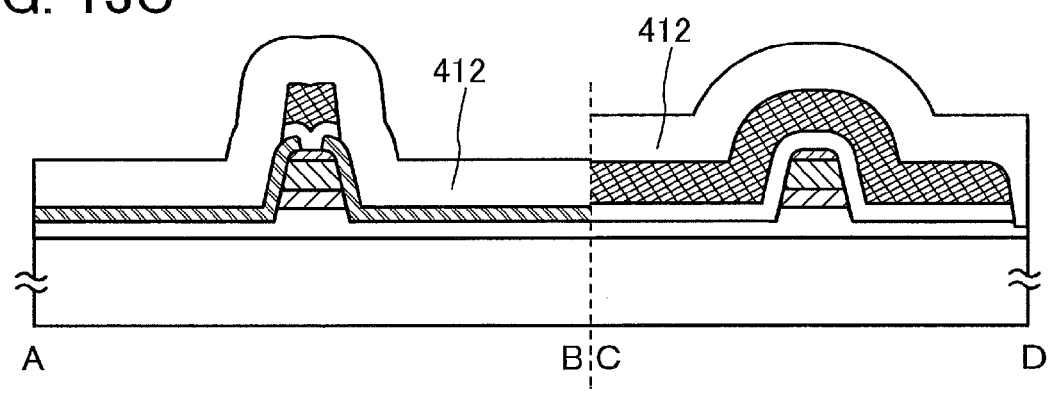

Next, the oxide insulating film 412 is formed over the source electrode 406a, the drain electrode 406b, and the gate electrode 410 (see FIG. 13C). The above embodiments can be referred to for materials and formation methods of the oxide insulating film 412.

Through the above process, the transistor 550 illustrated in FIGS. 8A to 8C can be manufactured.

This embodiment can be combined with any of the other embodiments in this specification as appropriate.

Embodiment 5

In this embodiment, an example of a circuit including the transistor of one embodiment of the present invention is described with reference to the drawings.

Figure 14A:
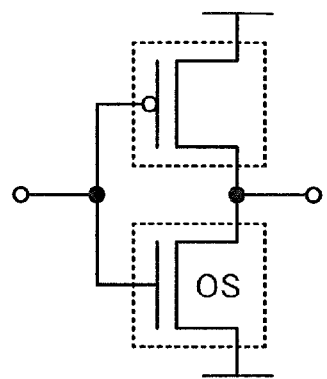
FIGS. 14A to 14D illustrate inverters including semiconductor devices of embodiments of the present invention.
Figure 14B:
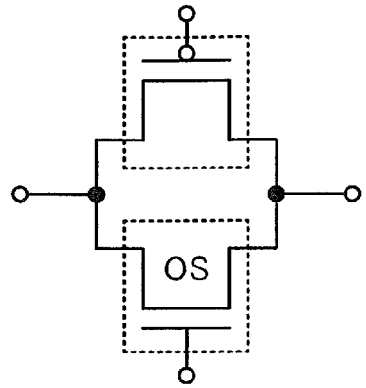
Figure 14C:
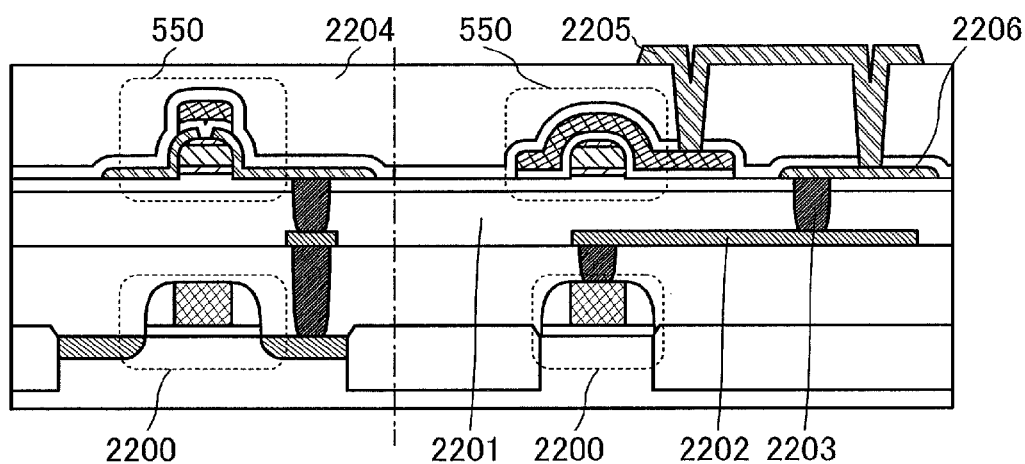
Figure 14D:
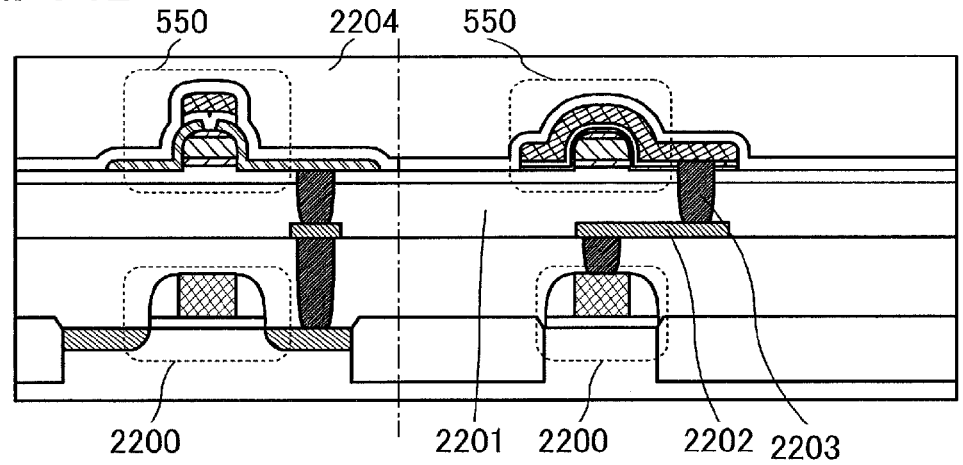

FIGS. 14A and 14B are each a circuit diagram of a semiconductor device and FIGS. 14C and 14D are each a cross-sectional view of a semiconductor device. FIGS. 14C and 14D each illustrate a cross-sectional view of the transistor 550 in a channel length direction on the left side and a cross-sectional view of the transistor 550 in a channel width direction on the right. In the circuit diagram, "OS" is written beside a transistor in order to clearly demonstrate that the transistor includes an oxide semiconductor.

The semiconductor devices illustrated in FIGS. 14C and 14D each include a transistor 2200 containing a first semiconductor material in a lower portion and a transistor containing a second semiconductor material in an upper portion. Here, an example is described in which the transistor 450 described in Embodiment 1 as an example is used as the transistor containing the second semiconductor material.

Here, the first semiconductor material and the second semiconductor material are preferably materials having different hand gaps. For example, a semiconductor material other than an oxide semiconductor (e.g., silicon, germanium, silicon germanium, silicon carbide, or gallium arsenide) can be used as the first semiconductor material, and the oxide semiconductor described in Embodiment 1 can be used as the second semiconductor material. A transistor using a material other than an oxide semiconductor, such as single crystal silicon, can operate at high speed easily, in contrast, a transistor including an oxide semiconductor has the low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, does not need to be limited to that described here except for the use of the transistor described in Embodiments 1 and 3, which is formed using an oxide semiconductor.

FIGS. 14A, 14C and 14D each illustrate a configuration what is called a CMOS circuit, in which a p-channel transistor and an n-channel transistor are connected in series and gates of the transistors are connected.

The transistor using an oxide semiconductor of one embodiment of the present invention has a high on-state current, which can achieve high-speed operation of a circuit.

In the structure illustrated in FIG. 14C, the transistor 550 is provided over the transistor 2200 with an insulating film 2201 positioned therebetween. Wirings 2202 are provided between the transistor 2200 and the transistor 550. Wirings and electrodes in the upper layer and the lower layer are electrically connected via plugs 2203 embedded in insulating films. An insulating film 2204 covering the transistor 550, a wiring 2205 over the insulating film 2204, and a wiring 2206 formed by processing the same conductive film as the pair of electrodes of the transistor are provided.

By stacking two transistors in the above manner, an area occupied by a circuit can be reduced; accordingly, a plurality of circuits can be arranged in high density.

In FIG. 14C, one of the source and the drain of the transistor 550 is electrically connected to one of a source and a drain of the transistor 2200 via the wiring 2202 and the plug 2203. The gate of the transistor 550 is electrically connected to a gate of the transistor 2200 via, the wiring 2205, the wiring 2206, the plug 2203, the wiring 2202, and the like.

In the configuration illustrated in FIG. 14D, an opening portion in which the plug 2203 is embedded is provided in a gate insulating film of the transistor 550, and the gate of the transistor 550 is in contact with the plug 2203. Such a configuration makes it possible to achieve the integration of the circuit easily and to reduce the lengths and the number of wirings and plugs used to be smaller than those in the configuration illustrated in FIG. 14C; thus, the circuit can operate at higher speed.

Note that when a connection between the electrodes of the transistor 550 and the transistor 2200 is changed from that in the configuration illustrated in FIG. 14C or FIG. 14D, a variety of circuits can be formed. For example, a circuit having a configuration in which a source and a drain of a transistor are connected to those of another transistor as illustrated in FIG. 14B can operate as what is called an analog switch.

A semiconductor device having an image sensor function for reading data of an object can be manufactured with the use of the transistor described in any of the above embodiments.

Figure 15:
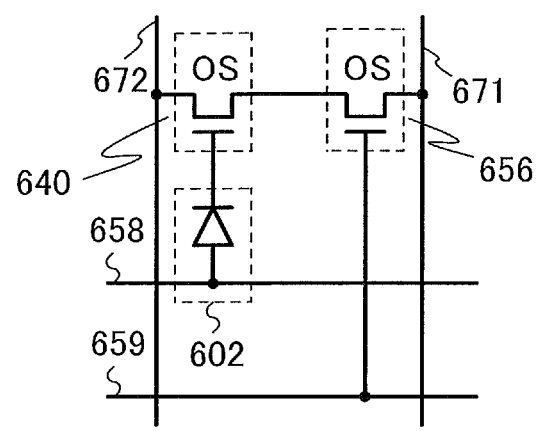
FIG. 15 is an equivalent circuit diagram illustrating an example of a semiconductor device.

FIG. 15 illustrates an example of an equivalent circuit of a semiconductor device having an image sensor function.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

As the photodiode 602, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 602, data on an object to be detected can be read. Note that a light source such as a backlight can be used at the time of reading data of an object.

As each of the transistors 640 and 656, the transistor in which a channel is formed in an oxide semiconductor, which is described in any of the above embodiments, can be used. In FIG. 15, "OS" is written beside the transistors 640 and 656 so that the transistors 640 and 656 can be identified as transistors including an oxide semiconductor.

It is preferable that each of the transistors 640 and 656 be one of the transistors described in the above embodiments, in which the oxide semiconductor film is electrically surrounded by the gate electrode. When the oxide semiconductor film has round end portions and a curved surface in the transistor, coverage with a film formed over the oxide semiconductor film can be improved. In addition, electric field concentration that might occur at end portions of the source electrode and the drain electrode can be reduced, which can suppress deterioration of the transistor. Therefore, variations in the electrical characteristics of the transistors 640 and 656 can be suppressed, and the transistors 640 and 656 are electrically stable. The semiconductor device having an image sensor function illustrated in FIG. 15 can have high reliability by including the transistor.

This embodiment can be combined with any of the other embodiments in this specification as appropriate.

Embodiment 6

In this embodiment, an example of a semiconductor device (memory device) that includes a transistor of one embodiment of the present invention, that can hold stored data even when not powered, and that has an unlimited number of write cycles is described with reference to drawings.

Figure 16:
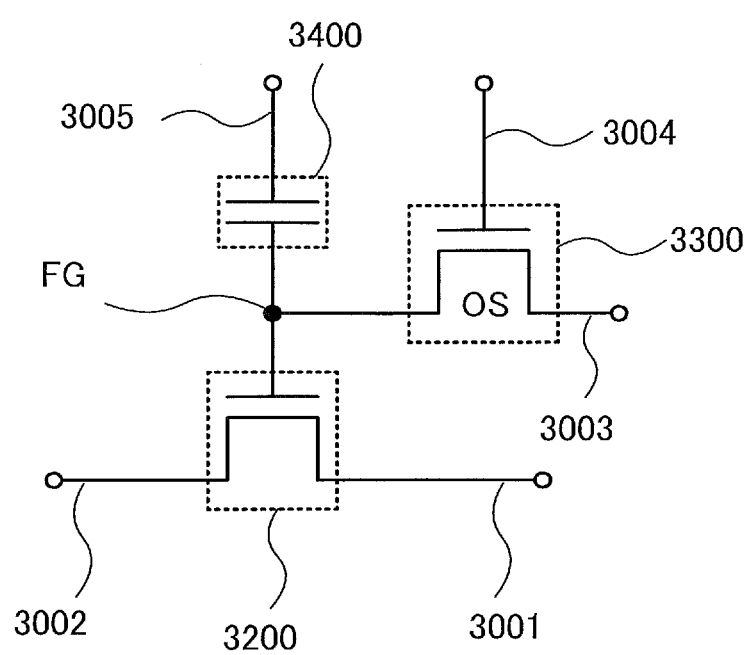
FIG. 16 is a circuit diagram of a semiconductor device of one embodiment of the present invention.

FIG. 16 is a circuit diagram of the semiconductor device.

The semiconductor device illustrated in FIG. 16 includes a transistor 3200 including a first semiconductor material, a transistor 3300 including a second semiconductor material, and a capacitor 3400. As the transistor 3300, the transistor described in Embodiments 1 and 3 can be used.

The transistor 3300 is a transistor in which a channel is formed in a semiconductor film including an oxide semiconductor. Since off-state current of the transistor 3300 is low, stored data can be held for a long period owing to such a transistor. In other words, power consumption can be sufficiently reduced because a semiconductor memory device in which refresh operation is unnecessary or the frequency of refresh operation is extremely low can be provided.

In FIG. 16, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 16 utilizes a characteristic in which the potential of the gate electrode of the transistor 3200 can be held, and thus enables writing, storing, and reading of data as follows.

Writing and holding of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Since the off-state current of the transistor 3300 is extremely low, the charge of the gate electrode of the transistor 3200 is held for a long time.

Next, reading of data is described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge is given to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the stored data can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential larger than $V_{th\_L}$ may be applied to the fifth wiring 3005.

When a transistor having a channel formation region formed using an oxide semiconductor and having an extremely low off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, a high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device of one embodiment of the present invention does not have a limit on the number of times of writing that is a problem in a conventional nonvolatile memory, and reliability thereof is drastically improved. Furthermore, data is written depending on the on state and the off state of the transistor, whereby high-speed operation can be easily achieved.

As described above, a miniaturized and highly integrated semiconductor device having favorable electrical characteristics can be provided.

Embodiment 7

In this embodiment, a CPU in which at least the transistor described in any of the above embodiments can be used and the storage device described in the above embodiment is included is described.

Figure 17:
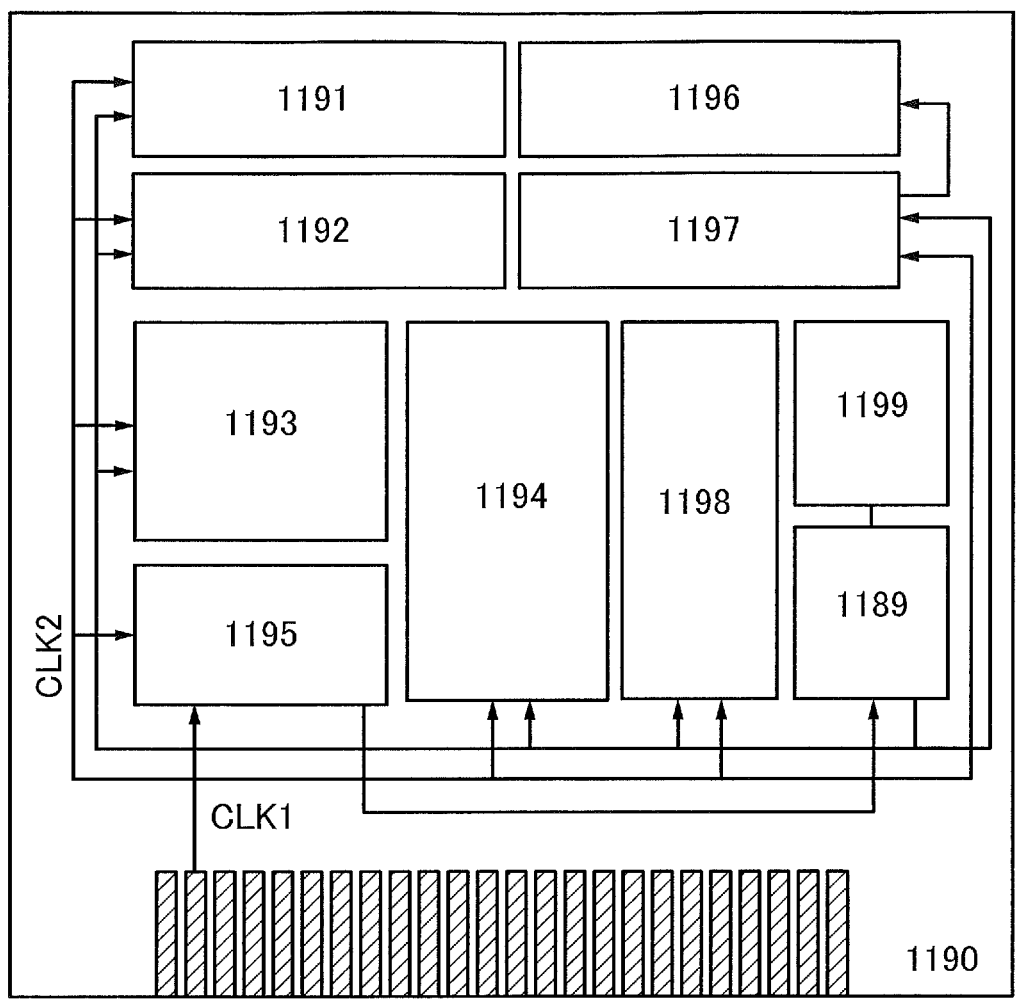
FIG. 17 is a block diagram of a semiconductor device of one embodiment.

FIG. 17 is a block diagram illustrating a configuration example of a CPU at least partly including the transistor described in Embodiment 1 or 3.

The CPU illustrated in FIG. 17 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 17 is only an example in which the structure is simplified, and an actual CPU may have various structures depending on the application. For example, the CPU may have the following configuration: a structure including the CPU illustrated in FIG. 17 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to action decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 17, a memory cell is provided in the register 1196. For the memory cell of the register 1196, any of the transistors described in the above embodiments can be used.

In the CPU illustrated in FIG. 17, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of a power supply voltage to the memory cell in the register 1196 can be stopped.

Figure 18:
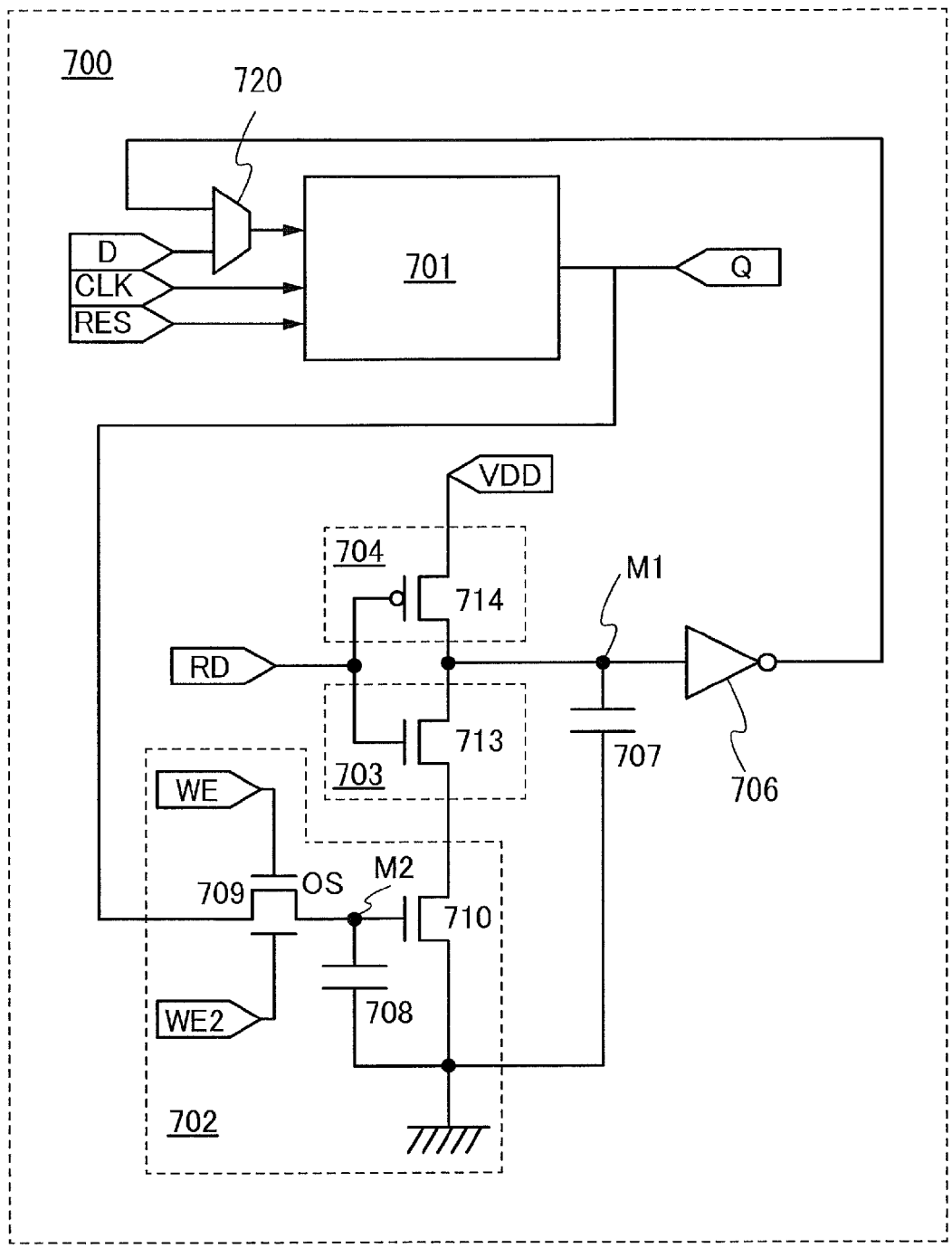
FIG. 18 is a circuit diagram of a memory device of one embodiment.

FIG. 18 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in the above embodiment can be used as the circuit 702. When supply of the power supply voltage to the memory element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line that can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line that can supply a power supply potential VDD is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line that can supply a low power supply potential (e.g., a GND line). The other of the pair of electrodes of the capacitor 708 can be supplied with constant potential. For example, the other of the pair of electrodes of the capacitor 708 can be supplied with a low power supply potential (e.g., GND) or a high power supply potential (e.g., VDD). The other of the pair of electrodes of the capacitor 708 is electrically connected to the line that can supply a low power supply potential (e.g., a GND line).

The capacitors 707 and 708 are not necessarily provided as long as the parasitic capacitance of the transistor, the parasitic capacitance of the wiring, or the like is actively utilized.

A control signal WE, is input to the first gate (first gate electrode) of the transistor 709. As for each of the switches 703 and 704, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 18 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 18, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 18, any of the transistors described in Embodiment 1 can be used. The transistor 709 preferably includes a second gate (second gate electrode). The control signal WE can be input to the first gate and the control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 (a drain current when the gate voltage of the transistor is 0 V) can be further decreased. Note that as the transistor 709, the transistor without the second gate can be used.

Further, in FIG. 18, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor film can be used for all the transistors used for the memory element 700. Further alternatively, in the memory element 700, a transistor in which a channel is formed in an oxide semiconductor film can be included besides the transistor 709, and a transistor in which a channel is formed in a layer or the substrate 1190 including a semiconductor other than an oxide semiconductor can be used for the reset of the transistors.

As the circuit 701 in FIG. 18, for example, a flip-flop circuit can be used. As the logic element 706, for example, an inverter, a clocked inverter, or the like can be used.

In the semiconductor device of one embodiment of the present invention, in a period during which the memory element 700 is not supplied with the power supply voltage, data stored in the circuit 701 can be held by the capacitor 708 that is provided in the circuit 702.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switches 703 and 704 are provided, the memory element performs pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Furthermore, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although an example in which the storage element 700 is used in a CPU is described in this embodiment, the storage element 700 can also be used in a digital signal processor (DSP), a custom LSI, an LSI such as a programmable logic device (PLD), and a radio frequency identification (RF-ID).

This embodiment can be combined with any of the other embodiments disclosed in this specification as appropriate.

Embodiment 8

The semiconductor device of one embodiment of the present invention can be used for display devices, personal computers, image reproducing devices provided with recording media (devices that reproduce the content of recording media such as digital versatile discs (DVDs) and have displays for displaying the reproduced images, as typical examples), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of such electronic devices are illustrated in FIGS. 19A to 19F.

Figure 19A:
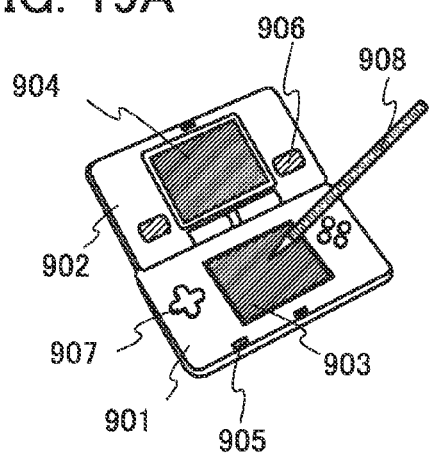
FIGS. 19A to 19F illustrate electronic devices of one embodiment of the present invention.

FIG. 19A illustrates a portable game console including a housing 901, a housing 902, a display portion 903, a display portion 904, a microphone 905, speakers 906, an operation key 907, a stylus 908, and the like. Although the portable game machine in FIG. 19A has the two display portions 903 and 904, the number of display portions included in a portable game machine is not limited to this.

Figure 19B:
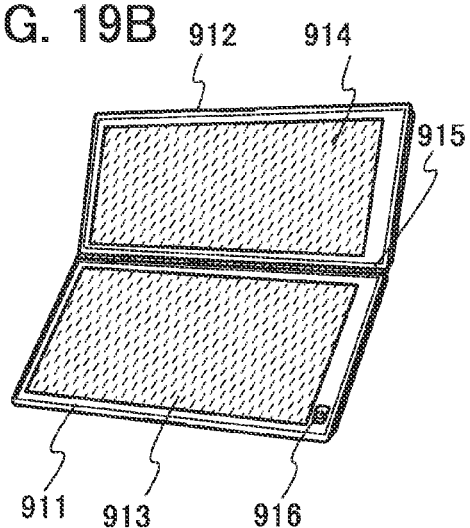

FIG. 19B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel area of a display device.

Figure 19C:
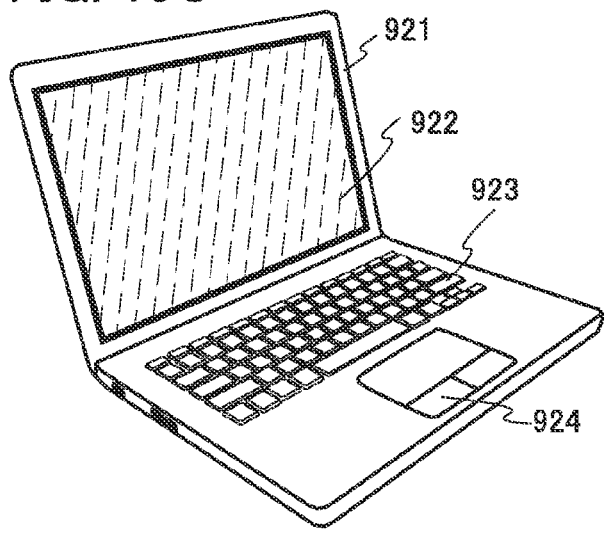

FIG. 19C illustrates a notebook personal computer, which includes a housing 921, a display portion 922, a keyboard 923, a pointing device 924, and the like.

Figure 19D:
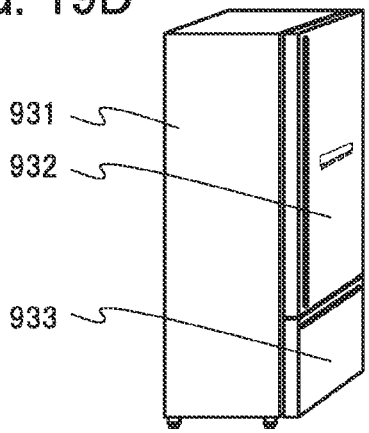

FIG. 19D illustrates the electric refrigerator-freezer including a housing 931, a door for a refrigerator 932, a door for a freezer 933, and the like.

Figure 19E:
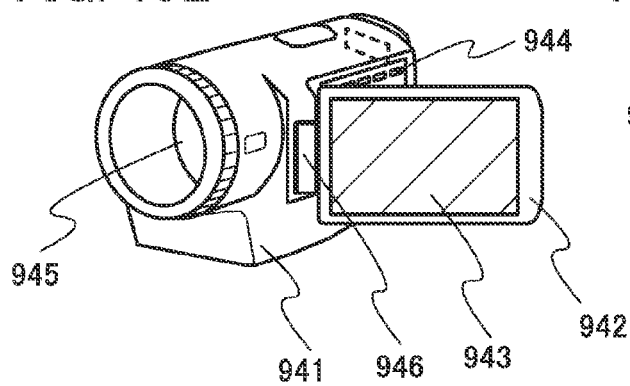

FIG. 19E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 19F:
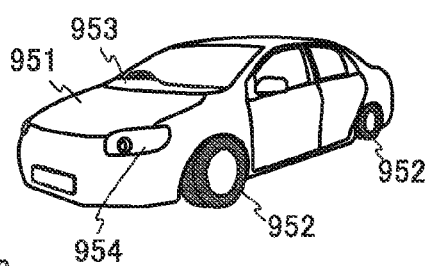

FIG. 19F illustrates an ordinary vehicle including a car body 951, heels 952, a dashboard 953, lights 954, and the like.

This embodiment can be combined with any of the other embodiments disclosed in this specification as appropriate.

Example

In this example, influence of the length of an oxide semiconductor film in the channel length direction on characteristics was calculated and evaluated.

First, structures of transistors are described.

Figure 20A:
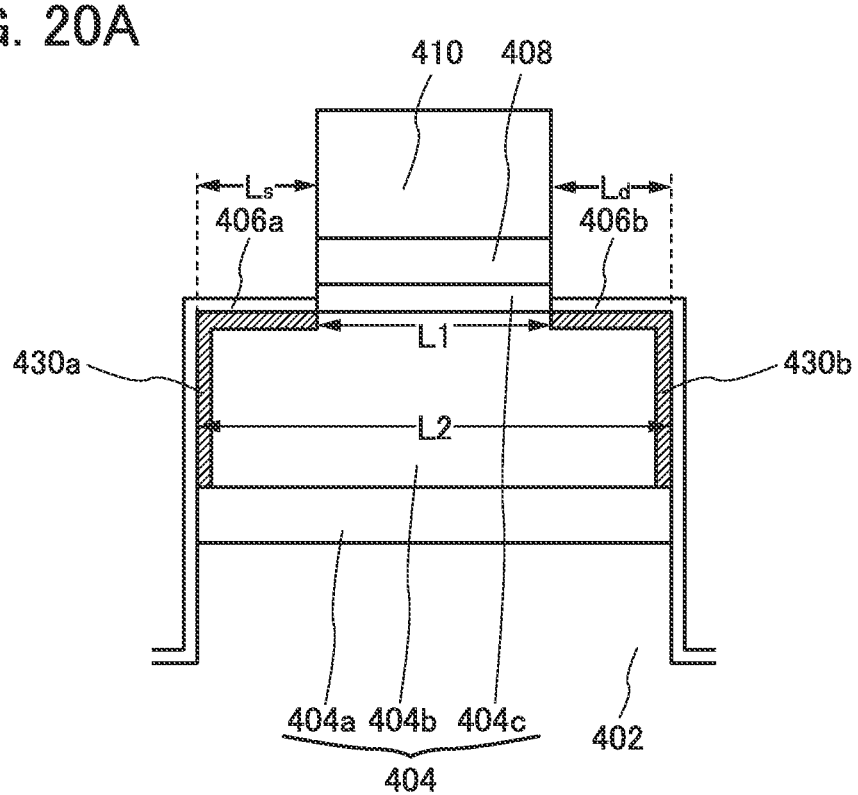
FIGS. 20A and 20B are each a schematic cross-sectional view of a transistor.
Figure 20B:
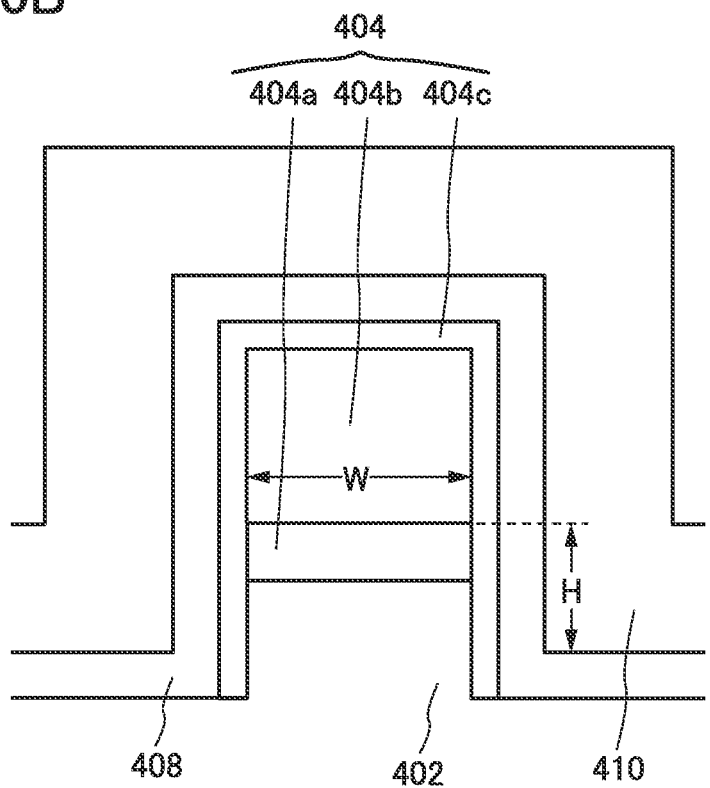

FIG. 20A is a cross-sectional view of the transistor in a channel length direction. In FIG. 20A, L1 represents the length between the source electrode 406a and the drain electrode 406b, and L2 represents the length of the oxide semiconductor film 404b in the channel length direction. N-type regions (also referred to as low-resistance regions 430a and 430b) in contact with the source electrode 406a and the drain electrode 406b were provided to a depth of 1 nm from the source electrode 406a and the drain electrode 406b. FIG. 20B is a cross-sectional view of a transistor in a channel width direction. In FIG. 20B, W represents a channel width and H represents the length from the bottom surface of the oxide semiconductor film 404b to the bottom surface of the gate electrode 410 (also referred to as the length of eaves). The length $L_s$ of a region in the channel length direction where the source electrode 406a overlaps with the oxide semiconductor film 404b is equal to the length $L_d$ of a region in the channel length direction where the drain electrode 406b overlaps with the oxide semiconductor film 404b. That is, $L_s$ and $L_d$ are each (L2−L1)/2.

Next, calculation conditions are described.

The calculation was performed under conditions shown in Table, using Sentaurus Device (produced by Synopsys, Inc.).

TABLE 1

| | | |
|---|---|---|
| Structure | channel length L1 | 40 nm or 120 nm |
| | channel width W | 40 nm |
| | length of S2 in channel length direction L2 - channel length L1 | 0 to 120 nm |
| GI | dielectric constant | 4.1 |
| | thickness of GI over S3 | 10 nm |
| | thickness of GI at side surface of S3 | 8 nm |

TABLE 1-continued

| | | |
|---|---|---|
| S3 | composition ratio | IGZO(132) |
| | electron affinity | 4.4 eV |
| | Eg | 3.6 eV |
| | dielectric constant | 15 |
| | donor density | 6.60E−9 cm$^{-3}$ |
| | electron mobility | 0.1 cm$^2$/Vs |
| | hole mobility | 0.01 cm$^2$/Vs |
| | Nc | 5.00E+18 cm$^{-3}$ |
| | Nv | 5.00E+18 cm$^{-3}$ |
| | thickness of S3 over S2 | 5 nm |
| | thickness of S3 at side surface of S2 | 4 nm |
| S2 | composition ratio | IGZO(111) |
| | electron affinity | 4.6 eV |
| | Eg | 3.2 eV |
| | dielectric constant | 15 |
| | donor density of channel portion | 6.60E−9 cm$^{-3}$ |
| | donor density under source and drain electrodes | 5.00E+18 cm$^{-3}$ |
| | electron mobility | 15 cm$^2$/Vs |
| | hole mobility | 0.01 cm$^2$/Vs |
| | Nc | 5.00E+18 cm$^{-3}$ |
| | Nv | 5.00E+18 cm$^{-3}$ |
| | thickness | 30 nm |
| S1 | composition ratio | IGZO(132) |
| | thickness | 10 nm |
| Base insulating film | dielectric constant | 4.1 |
| | thickness | 400 nm |
| GE | work function | 5 eV |
| S/D | work function | 4.6 eV |
| | Length of eaves of side gate | 20 nm |

*IGZO(111) . . . oxide target with In:Ga:Zn = 1:1:1 (atomic ratio)
*IGZO(132) . . . oxide target with In:Ga:Zn = 1:3:2 (atomic ratio)

In the table, GI represents the gate insulating film 408; S3, the oxide semiconductor film 404c; S2, the oxide semiconductor film 404b; S1, the oxide semiconductor film 404a; GE, the gate electrode 410; and S/D, the source electrode 406a and the drain electrode 406b.

Figure 21A:
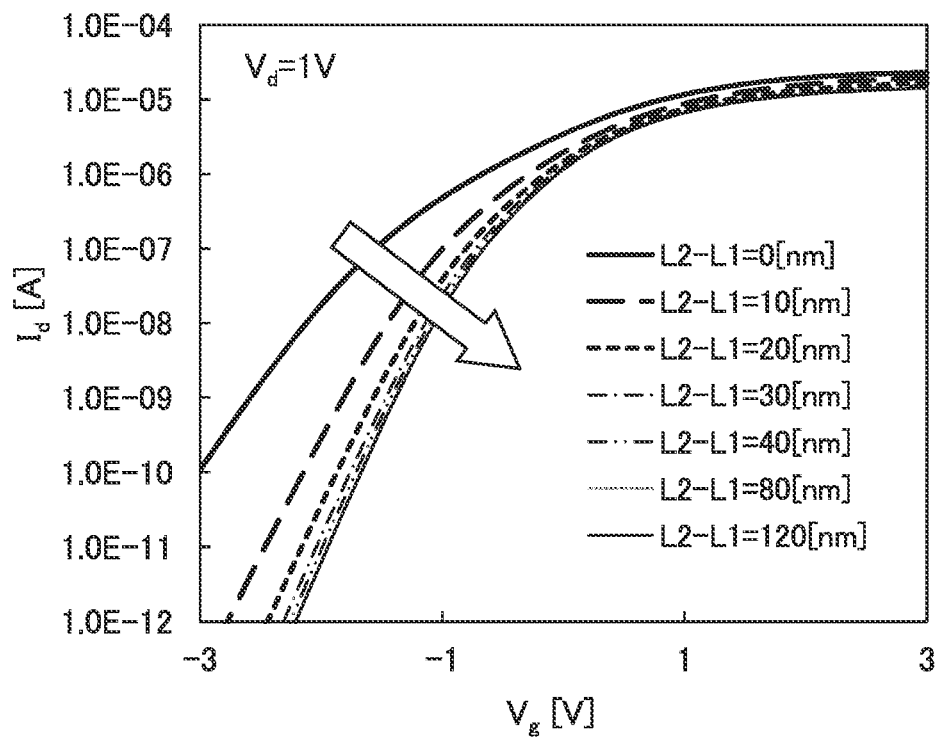
FIGS. 21A and 21B each show $I_d$-$V_g$ characteristics of a transistor.
Figure 21B:
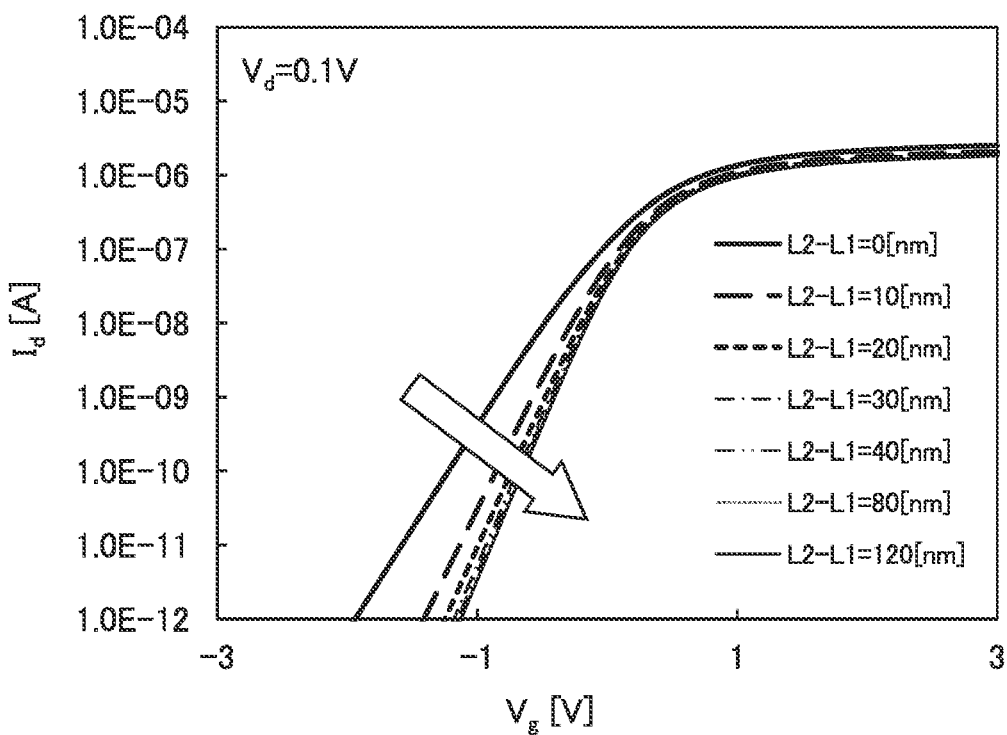

First, in the case where L1 is 40 nm, L2 is increased by 10 nm when L2 is in the range between 40 nm and 80 nm and is increased by 40 nm when L2 is in the range between 80 nm and 160 nm. FIGS. 21A and 21B show the $I_d$-$V_g$ characteristics of transistors with predetermined lengths of L2−L1. FIGS. 21A and 21B show the $I_d$-$V_g$ characteristics with 1 V and 0.1 V of the drain voltage ($V_d$:[V]), respectively. FIGS. 21A and 21B indicate that L2−L1 increases from the bottom to the tip of the arrows.

As shown in FIGS. 21A and 21B, as L2−L1 increases, the off-state current is reduced, and then, the S value is improved.

FIGS. 22A to 22C and FIGS. 23A to 23C show the values of characteristics of the transistors, which were obtained from the $I_d$-$V_g$ characteristics in FIGS. 21A and 21B.

Figure 22A:
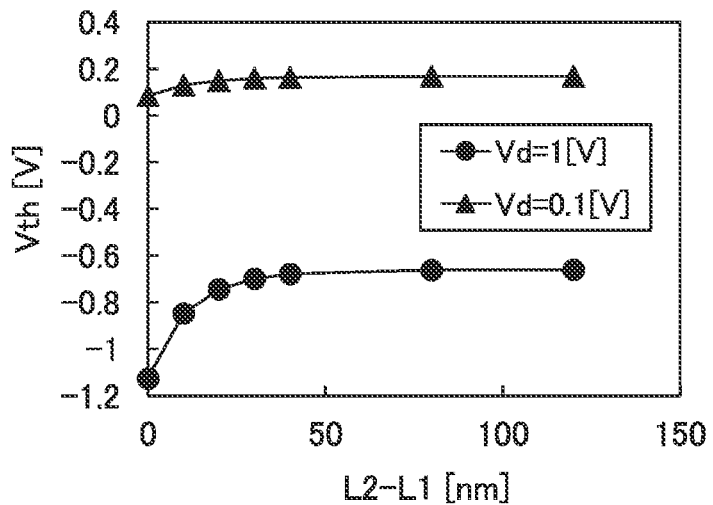
FIGS. 22A to 22C show the values of the characteristics of a transistor.
Figure 22B:
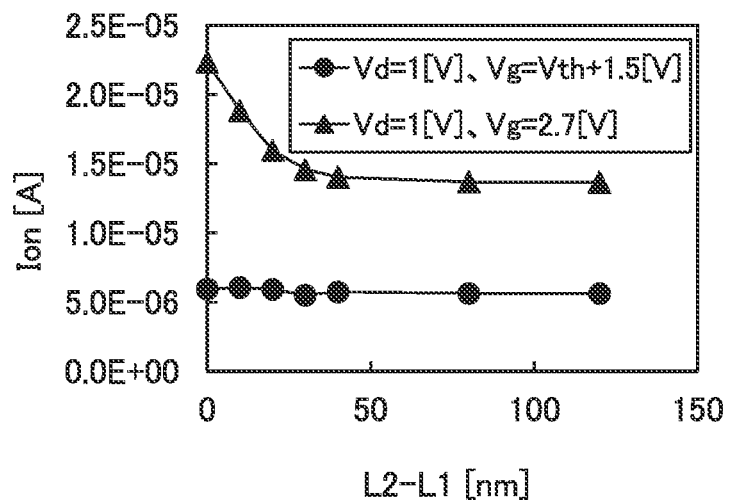
Figure 22C:
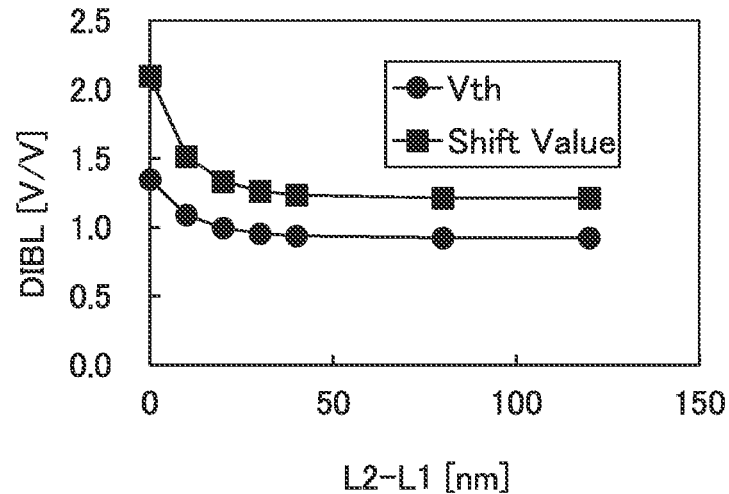
Figure 23A:
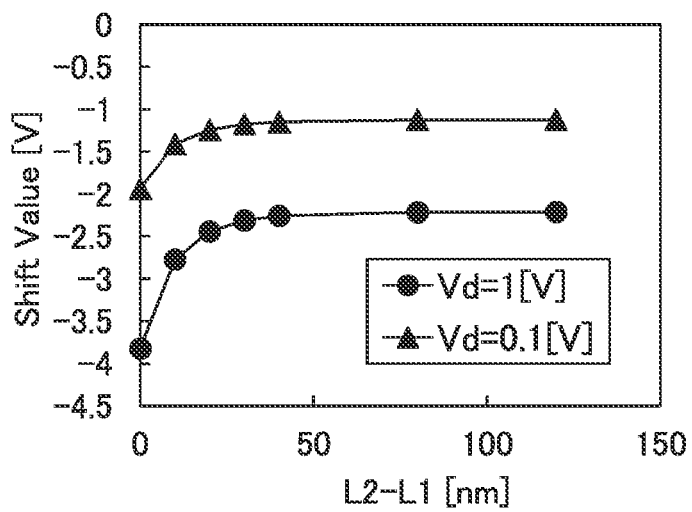
FIGS. 23A to 23C show the values of the characteristics of a transistor.
Figure 23B:
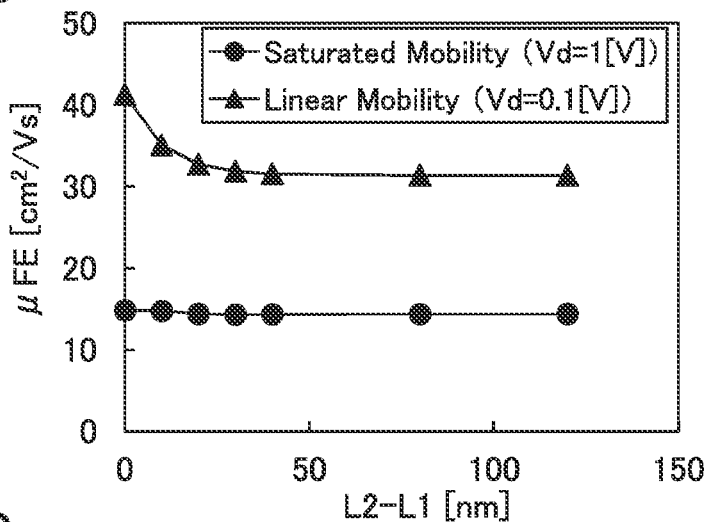
Figure 23C:
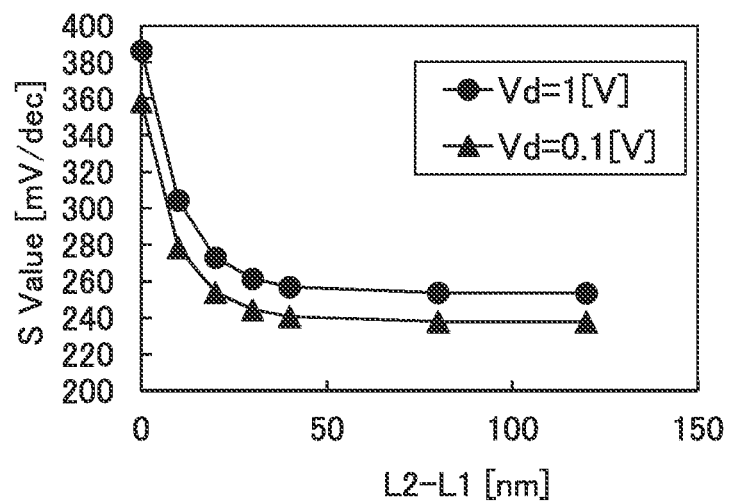

FIG. 22A is a graph showing a relation between L2−L1 and the threshold voltage Vth, FIG. 22B is a graph showing a relation between L2−L1 and the on-state current Ion, and FIG. 22C is a graph showing a relation between L2−L1 and the drain-induced barrier lowering (DIBL). FIG. 23A is a graph showing a relation between L2−L1 and the shift value, FIG. 23B is a graph showing a relation between L2−L1 and the mobility μFE, and FIG. 23C is a graph showing a relation between L2−L1 and the S value. Note that the shift value is a value of the gate voltage at a drain current of 1.0×10$^{-12}$ A.

FIGS. 22A to 22C and FIGS. 23A to 23C show that the values of the characteristics of the transistor are changed when L2−L1 is shorter than 40 nm. In addition, the values of the characteristics of the transistor are hardly changed when L2−L1 is longer than or equal to 40 nm. It is also found that in consideration of variations in the characteristics of the transistor, L2−L1 is preferably 0.2 times to 2.0 times, more preferably 0.5 times to 2.0 times, as long as L1, and is preferably longer than or equal to 30 nm and shorter than or equal to 60 nm, more preferably longer than or equal to 40 nm and shorter than or equal to 50 nm.

Figure 24A:
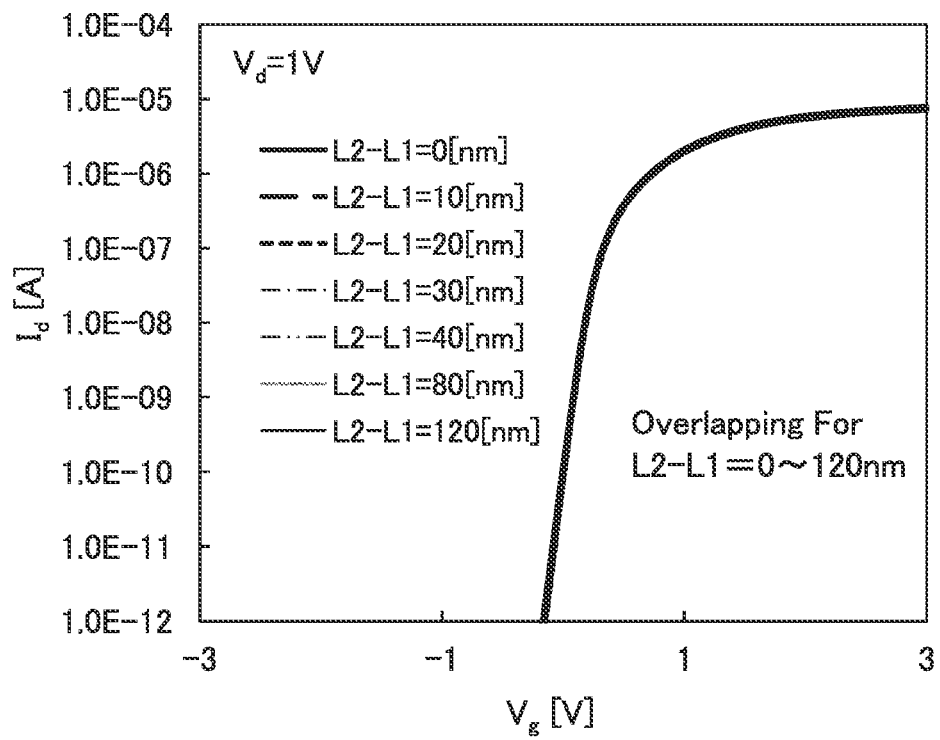
FIGS. 24A and 24B each show $I_d$-$V_g$ characteristics of a transistor.
Figure 24B:
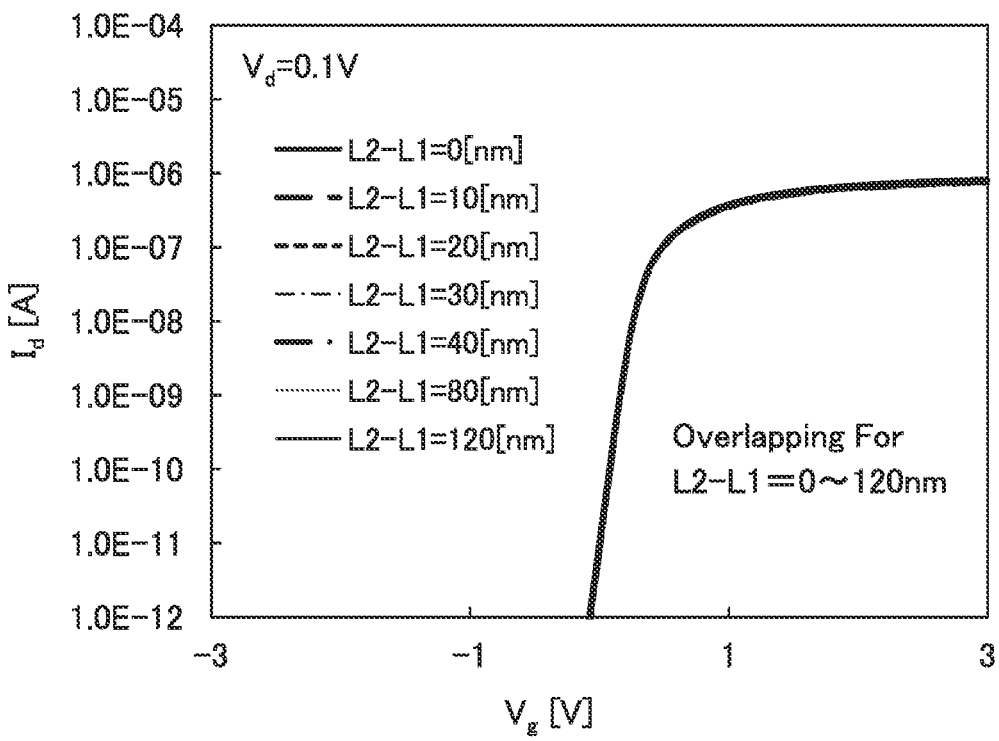

Next, in the case where L1 is 120 nm, L2 is increased by 10 nm when $L_s$ is in the range between 120 nm and 160 nm and is increased by 40 nm when $L_s$ is in the range between 160 nm and 240 nm. FIGS. 24A and 24B show the $I_d$-$V_g$ characteristics of L2−L1. FIGS. 24A and 24B show the $I_d$-$V_g$ characteristics with 1 V and 0.1 V of the drain voltage ($V_d$:[V]), respectively.

As shown in FIGS. 24A and 24B, even when L2−L1 is changed, the S value and the on-state current are hardly changed.

FIGS. 25A to 25C and FIGS. 26A to 26C show the values of characteristics of the transistors, which were obtained from the $I_d$-$V_g$ characteristics in FIGS. 24A and 24B.

Figure 25A:
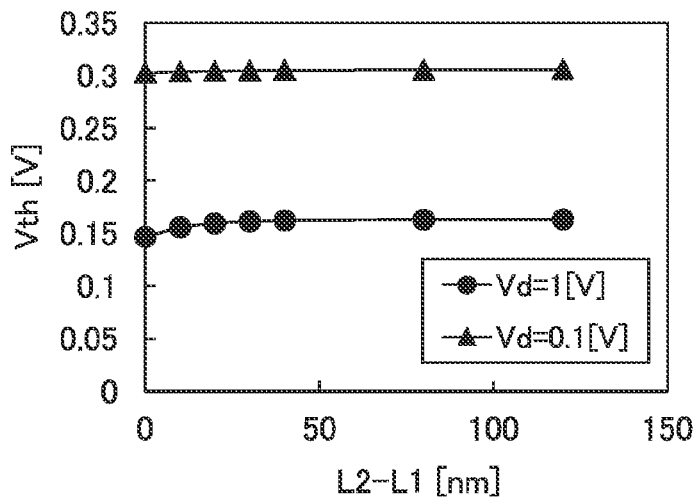
FIGS. 25A to 25C show the values of the characteristics of a transistor.
Figure 25B:
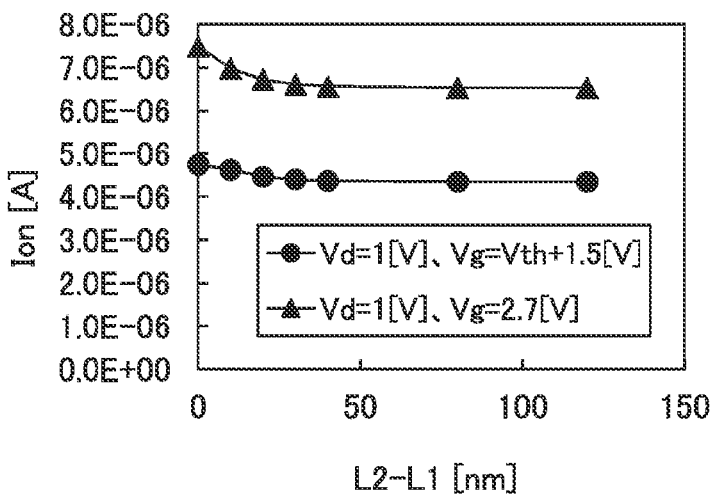
Figure 25C:
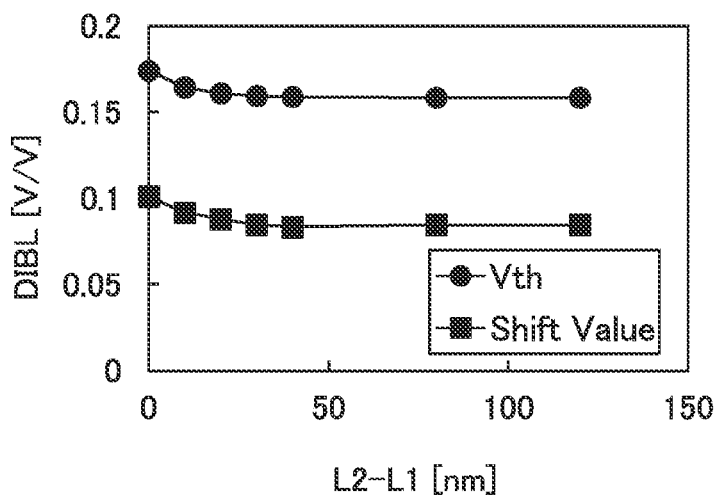
Figure 26A:
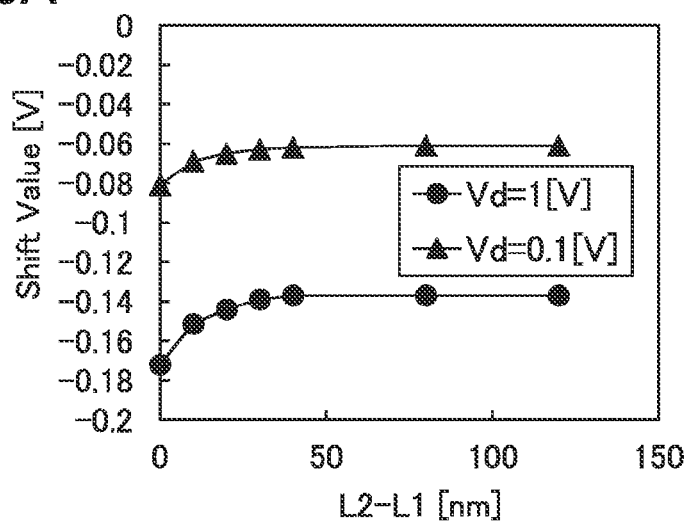
FIGS. 26A to 26C show the values of the characteristics of a transistor.
Figure 26B:
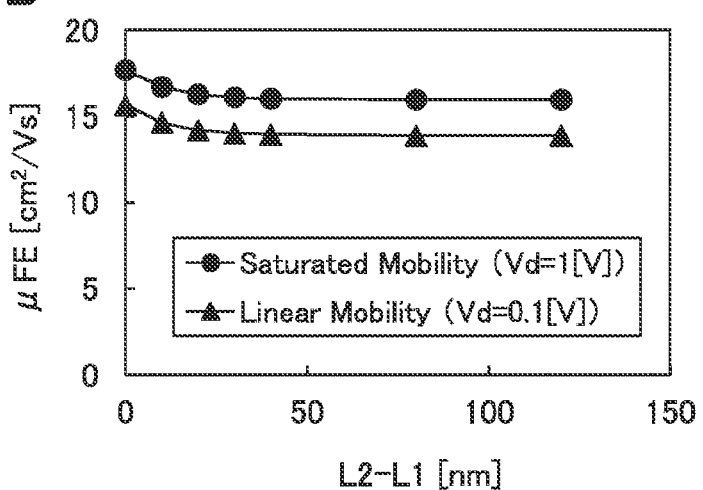
Figure 26C:
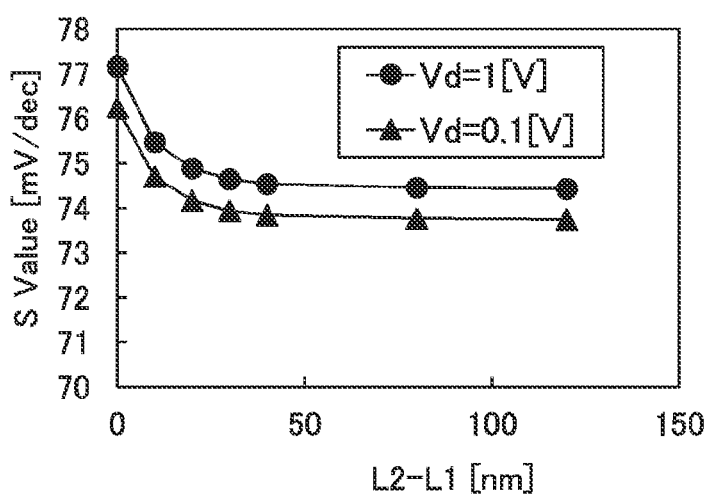

FIG. 25A is a graph showing a relation between L2−L1 and the threshold voltage Vth, FIG. 25B is a graph showing a relation between L2−L1 and the on-state current Ion, and FIG. 25C is a graph showing a relation between L2−L1 and the DIBL. FIG. 26A is a graph showing a relation between L2−L1 and the shift value, FIG. 26B is a graph showing a relation between L2−L1 and the mobility μFE, and FIG. 26C is a graph showing a relation between L2−L1 and the S value.

FIGS. 25A to 25C and FIGS. 26A to 26C show that the values of the characteristics of the transistor are changed when L2−L1 is shorter than 40 nm. In addition, the values of the characteristics of the transistor are hardly changed when L2−L1 is longer than or equal to 40 nm. It is also found that in consideration of variations in the characteristics of the transistor, L2−L1 is preferably 0.2 times to 2.0 times, more preferably 0.5 times to 2.0 times, as long as L1, and is preferably longer than or equal to 30 nm and shorter than or equal to 60 nm, more preferably longer than or equal to 40 nm and shorter than or equal to 50 nm.

The reason why the $I_d$-$V_g$ characteristics are changed when L2−L1 is shorter than 40 nm and are hardly changed when L2−L1 is longer than or equal to 40 nm is probably an influence of the depth of the electric field to the oxide semiconductor film by the gate electrode to which a voltage is applied. The reason is described using the transistor in FIGS. 27A and 27B.

Figure 27A:
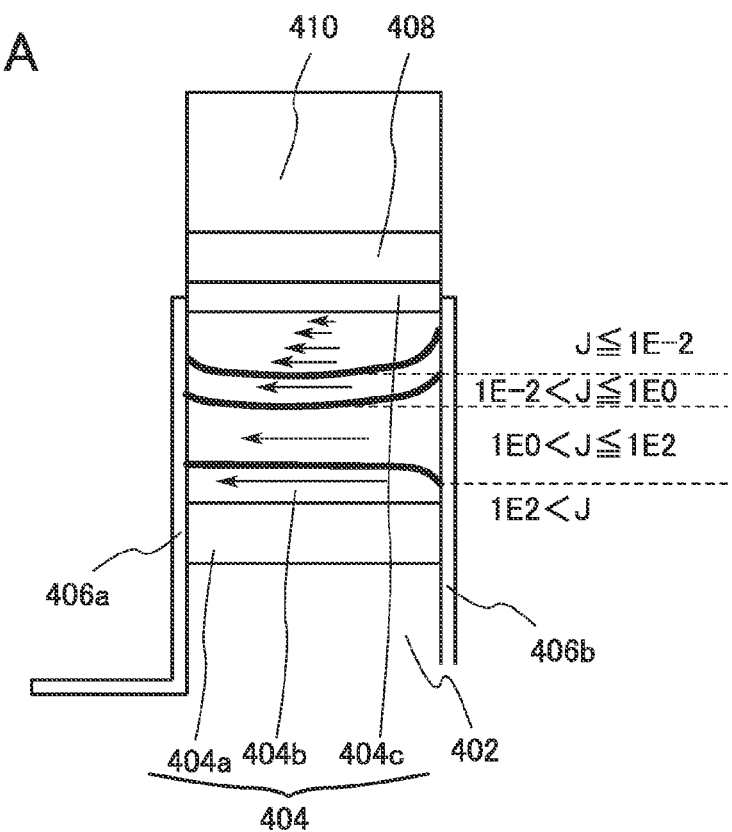
FIGS. 27A and 27B show distribution of a current density in the channel length direction.
Figure 27B:
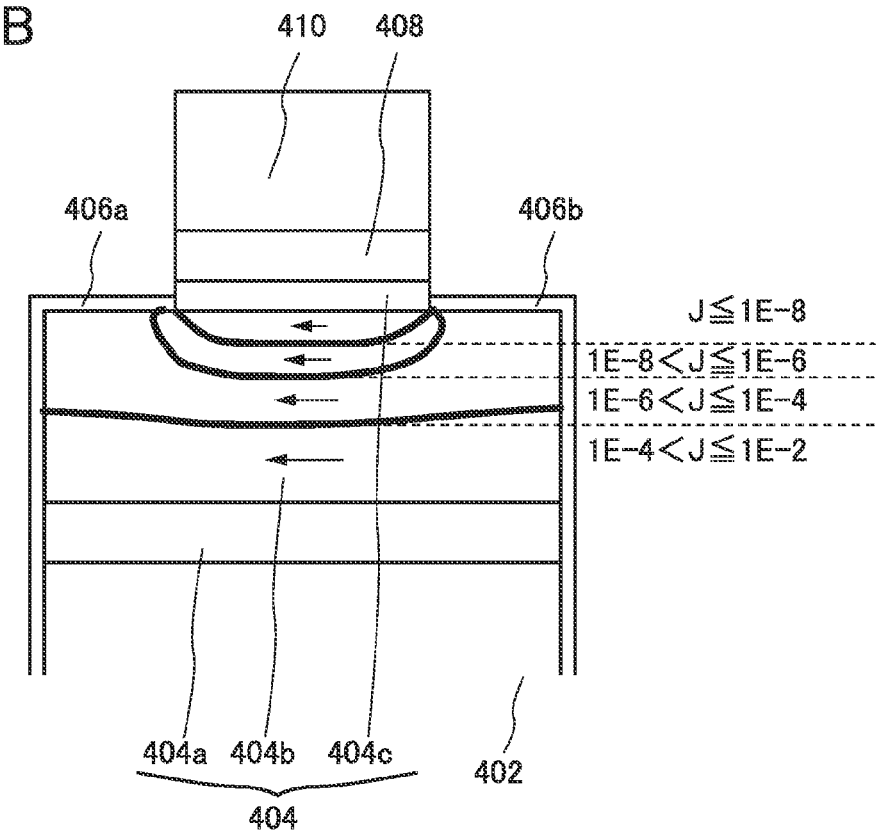

FIG. 27A shows the distribution of the current density J [A/cm$^2$] of the oxide semiconductor film 404b in the channel length direction when L1=L2=40 nm, $V_d$=1 V, and $V_g$=−3 V. FIG. 27B shows the distribution of the current density J [A/cm$^2$] of the oxide semiconductor film 404b in the channel length direction when L1=40 nm, L2=80 nm, $V_d$=1 V, and $V_g$=−3 in FIGS. 27A and 27B, the current density J is logarithmically shown; the bold line is drawn where the current density J becomes 100 times as large or small as that of its adjacent bold line. Note that the arrows in FIGS. 27A and 27B show vectors of current.

In FIG. 27A, when a voltage of −3 V is applied to the gate electrode 410, current can be cut down to 1E−2 [A/cm$^2$] or smaller on the side of the oxide semiconductor film 404b that is close to the gate electrode. In contrast, on the side (back channel side) of the oxide semiconductor film 404b that is far from the gate electrode 410, an electric field is suppressed by the influence of the source electrode 406a and the drain electrode 406b that are positioned on side surfaces of the oxide semiconductor film 404b in the channel length direction; thus, a negative potential of the gate electrode 410 hardly reach the back channel side. As a result, a current of 1E2 [A/cm$^2$] or more flows.

In contrast, in FIG. 27B, the source electrode 406a and the drain electrode 406b on side surfaces of the oxide semiconductor film 404b in the channel length direction are positioned at some distance from the gate electrode 410; thus, the negative potential of the gate electrode reaches aside of the oxide semiconductor film 404b close to the oxide semiconductor film 404a, and the current density J is smaller than or equal to 1E−2 [A/cm$^2$] in the whole oxide semiconductor film 404b.

In sum, when L2 decreases (L2−L1 decreases), current on the back channel side increases, whereby the on-state current increases and the off-state current also increases. As a result, the S value increases. In contrast, when L2 increases (L2−L1 increases), the on-state current decreases, but a leakage current on the back channel side also decreases; thus, the S value decreases. In this example, when L2−L1 was longer than or equal to 40 nm, the electric field of the gate electrode 410 hardly affected the values of the characteristics, and the values were saturated.

This application is based on Japanese Patent Application serial No. 2013-184772 filed with Japan Patent Office on Sep. 6, 2013, the entire contents of which are hereby incorporated by reference.

What is claimed is:

1. A semiconductor device comprising:
a first oxide semiconductor film over an insulating surface;
a second oxide semiconductor film over the first oxide semiconductor film;
a source electrode and a drain electrode in contact with a side surface of the first oxide semiconductor film, a side surface of the second oxide semiconductor film, and a top surface of the second oxide semiconductor film;
a third oxide semiconductor film over the second oxide semiconductor film, the source electrode, and the drain electrode;
a gate insulating film over the third oxide semiconductor film; and
a gate electrode in contact with a top surface of the gate insulating film and facing the top surface and the side surface of the second oxide semiconductor film,
wherein the second oxide semiconductor film has a first length in a channel length direction,
wherein the source electrode and the drain electrode have a second length between the source electrode and the drain electrode, and
wherein a third length obtained by subtracting the second length from the first length is 0.2 times to 2.0 times as long as the second length.

2. The semiconductor device according to claim 1, wherein the third length is longer than or equal to 30 nm and shorter than or equal to 60 nm.

3. The semiconductor device according to claim 1, wherein the first length is shorter than or equal to 40 nm.

4. The semiconductor device according to claim 1, wherein a channel width is shorter than or equal to 10 nm.

5. A semiconductor device comprising:
a first oxide semiconductor film over an insulating surface;
a second oxide semiconductor film over the first oxide semiconductor film;
a third oxide semiconductor film over the second oxide semiconductor film;
a source electrode and a drain electrode in contact with a side surface of the first oxide semiconductor film, a side surface of the second oxide semiconductor film, a side surface of the third oxide semiconductor film, and a top surface of the third oxide semiconductor film;
a gate insulating film over the third oxide semiconductor film, the source electrode, and the drain electrode; and
a gate electrode in contact with a top surface of the gate insulating film and facing a top surface and the side surface of the second oxide semiconductor film,
wherein the second oxide semiconductor film has a first length in a channel length direction,
wherein the source electrode and the drain electrode have a second length between the source electrode and the drain electrode, and
wherein a third length obtained by subtracting the second length from the first length is 0.2 times to 2.0 times as long as the second length.

6. The semiconductor device according to claim 5, wherein the third length is longer than or equal to 30 nm and shorter than or equal to 60 nm.

7. The semiconductor device according to claim 5, wherein the first length is shorter than or equal to 40 nm.

8. The semiconductor device according to claim 5, wherein a channel width is shorter than or equal to 40 nm.

* * * * *